US012563871B2

(12) United States Patent
Moon et al.

(10) Patent No.: US 12,563,871 B2
(45) Date of Patent: Feb. 24, 2026

(54) DISPLAY DEVICE USING MICRO-LEDS AND METHOD FOR MANUFACTURING SAME

(71) Applicant: LG ELECTRONICS INC., Seoul (KR)

(72) Inventors: Seongmin Moon, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 793 days.

(21) Appl. No.: 17/765,763

(22) PCT Filed: Oct. 2, 2019

(86) PCT No.: PCT/KR2019/012893
§ 371 (c)(1),
(2) Date: Mar. 31, 2022

(87) PCT Pub. No.: WO2021/066221
PCT Pub. Date: Apr. 8, 2021

(65) Prior Publication Data
US 2022/0367757 A1 Nov. 17, 2022

(30) Foreign Application Priority Data
Oct. 1, 2019 (KR) ......................... 10-2019-0121374

(51) Int. Cl.
*H10H 20/831* (2025.01)
*H10H 20/01* (2025.01)
(Continued)

(52) U.S. Cl.
CPC ........ *H10H 20/8312* (2025.01); *H10H 20/01* (2025.01); *H10H 20/857* (2025.01);
(Continued)

(58) Field of Classification Search
CPC .. H10H 20/8312; H10H 20/01; H10H 20/857; H10H 20/032; H10H 20/0364;
(Continued)

(56) References Cited

U.S. PATENT DOCUMENTS

| | | | |
|---|---|---|---|
| 2009/0139755 A1* | 6/2009 | Kusano | H05K 3/3442 29/832 |
| 2013/0037833 A1* | 2/2013 | Nam | H01L 25/0753 257/E33.056 |

(Continued)

FOREIGN PATENT DOCUMENTS

| | | |
|---|---|---|
| JP | 2013-80874 A | 5/2013 |
| KR | 10-2019-0031047 A | 3/2019 |
| KR | 10-2019-0105537 A | 9/2019 |
| KR | 10-2019-0106885 A | 9/2019 |

*Primary Examiner* — Fernando L Toledo
*Assistant Examiner* — Marshall Mu-Nuo Hatfield
(74) *Attorney, Agent, or Firm* — Birch, Stewart, Kolasch & Birch, LLP

(57) ABSTRACT

The present disclosure provides a display device using semiconductor light-emitting elements mounted on an assembly substrate in fluid, and a method for manufacturing same. The assembly substrate on which semiconductor light-emitting elements are mounted (assembled) comprises first assembly electrodes and second assembly electrodes intersecting the first assembly electrodes. By a dielectrophoretic force generated by applying a voltage to the assembly electrodes, semiconductor light-emitting elements may be mounted at the intersections of the assembly electrodes. In addition, by using the assembly substrate as a repair substrate, a region of the substrate in which assembly defects have occurred can be repaired, after assembly or transfer of the semiconductor light-emitting elements.

14 Claims, 29 Drawing Sheets

(51) Int. Cl.
    *H10H 20/857*       (2025.01)
    *H10H 29/14*        (2025.01)

(52) U.S. Cl.
    CPC ......... *H10H 29/142* (2025.01); *H10H 20/032*
              (2025.01); *H10H 20/0364* (2025.01)

(58) Field of Classification Search
    CPC .. H10H 29/142; H10D 8/043; H10D 30/0295;
            H10D 84/858; H01L 25/0753; H01L
            25/167; H01L 21/28; H01L 21/76895;
                H01L 2224/0344; H02K 15/108
    See application file for complete search history.

(56)               References Cited

U.S. PATENT DOCUMENTS

| | | | |
|---|---|---|---|
| 2016/0079333 A1* | 3/2016 | Shishido .............. | H10K 59/131 |
| | | | 257/72 |
| 2016/0315068 A1* | 10/2016 | Lee ...................... | H10H 20/857 |
| 2017/0338211 A1 | 11/2017 | Lin et al. | |
| 2018/0158979 A1 | 6/2018 | Schuele et al. | |
| 2019/0157340 A1 | 5/2019 | Liao et al. | |
| 2019/0244985 A1* | 8/2019 | Kim .................... | H10H 20/8316 |
| 2019/0259910 A1* | 8/2019 | Sung ................... | H10H 20/825 |
| 2019/0280176 A1* | 9/2019 | Lee ...................... | H10H 20/852 |
| 2019/0288168 A1* | 9/2019 | Kong ................... | H10H 20/855 |

\* cited by examiner

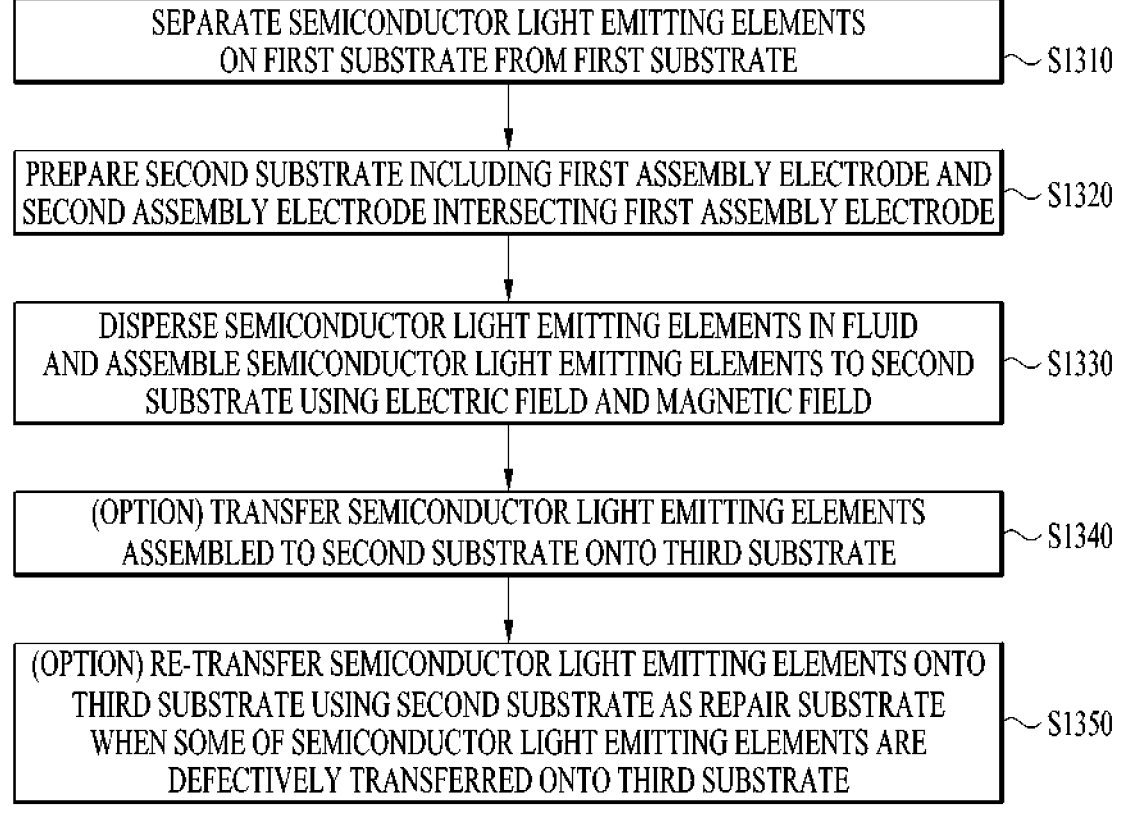

SEPARATE SEMICONDUCTOR LIGHT EMITTING ELEMENTS
ON FIRST SUBSTRATE FROM FIRST SUBSTRATE ~ S1310

PREPARE SECOND SUBSTRATE INCLUDING FIRST ASSEMBLY ELECTRODE AND
SECOND ASSEMBLY ELECTRODE INTERSECTING FIRST ASSEMBLY ELECTRODE ~ S1320

DISPERSE SEMICONDUCTOR LIGHT EMITTING ELEMENTS IN FLUID
AND ASSEMBLE SEMICONDUCTOR LIGHT EMITTING ELEMENTS TO SECOND
SUBSTRATE USING ELECTRIC FIELD AND MAGNETIC FIELD ~ S1330

(OPTION) TRANSFER SEMICONDUCTOR LIGHT EMITTING ELEMENTS
ASSEMBLED TO SECOND SUBSTRATE ONTO THIRD SUBSTRATE ~ S1340

(OPTION) RE-TRANSFER SEMICONDUCTOR LIGHT EMITTING ELEMENTS ONTO
THIRD SUBSTRATE USING SECOND SUBSTRATE AS REPAIR SUBSTRATE
WHEN SOME OF SEMICONDUCTOR LIGHT EMITTING ELEMENTS ARE
DEFECTIVELY TRANSFERRED ONTO THIRD SUBSTRATE ~ S1350

FIG. 14

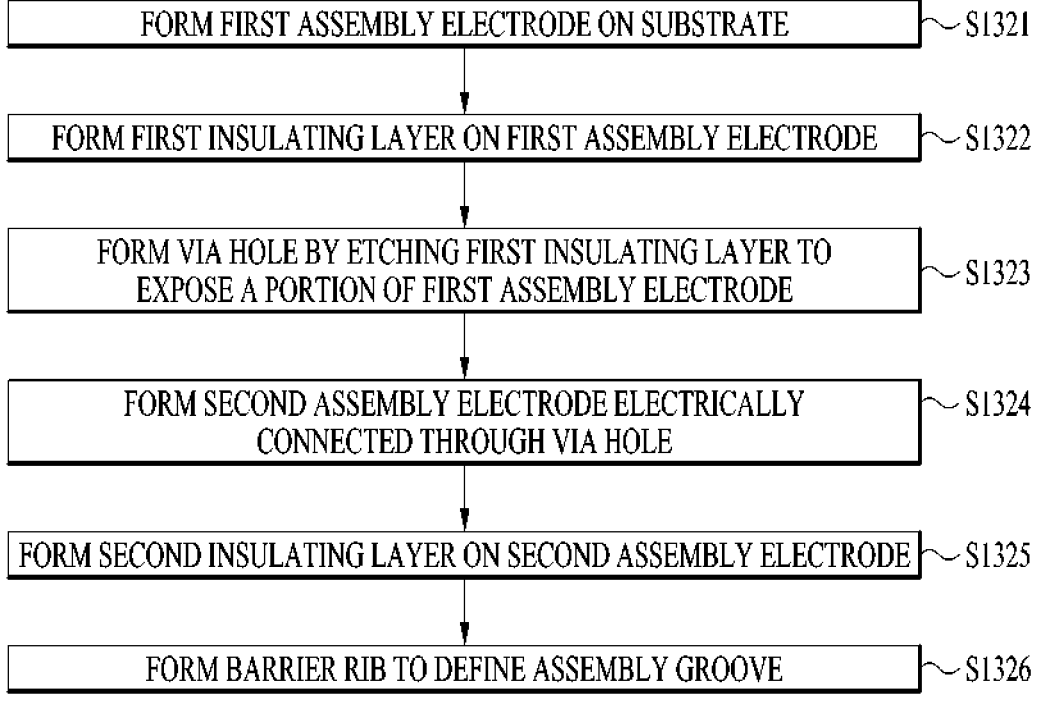

| FORM FIRST ASSEMBLY ELECTRODE ON SUBSTRATE | ~S1321 |

| FORM FIRST INSULATING LAYER ON FIRST ASSEMBLY ELECTRODE | ~S1322 |

| FORM VIA HOLE BY ETCHING FIRST INSULATING LAYER TO EXPOSE A PORTION OF FIRST ASSEMBLY ELECTRODE | ~S1323 |

| FORM SECOND ASSEMBLY ELECTRODE ELECTRICALLY CONNECTED THROUGH VIA HOLE | ~S1324 |

| FORM SECOND INSULATING LAYER ON SECOND ASSEMBLY ELECTRODE | ~S1325 |

| FORM BARRIER RIB TO DEFINE ASSEMBLY GROOVE | ~S1326 |

FIG. 16
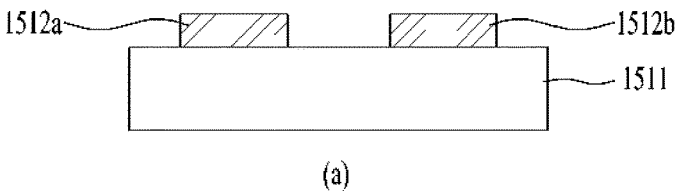
(a)
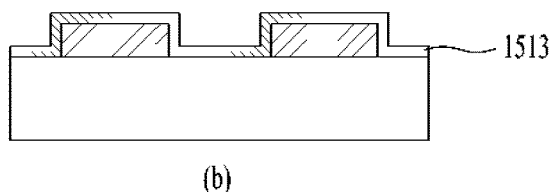
(b)
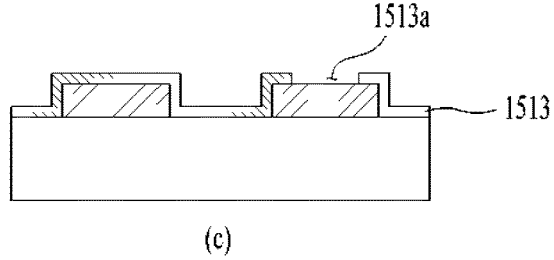
(c)
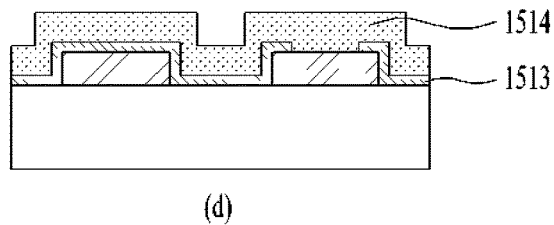
(d)
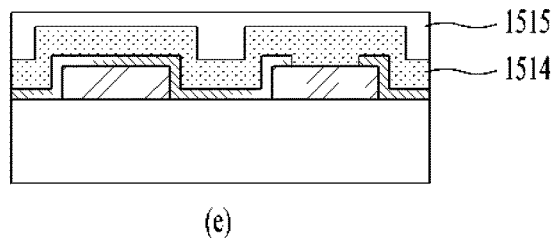
(e)
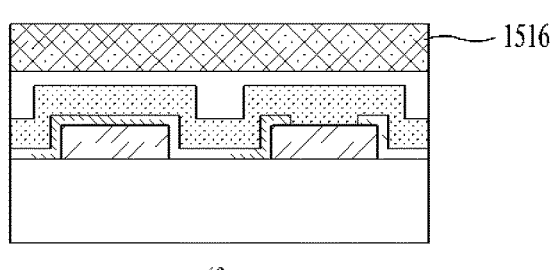
(f)

FIG. 18
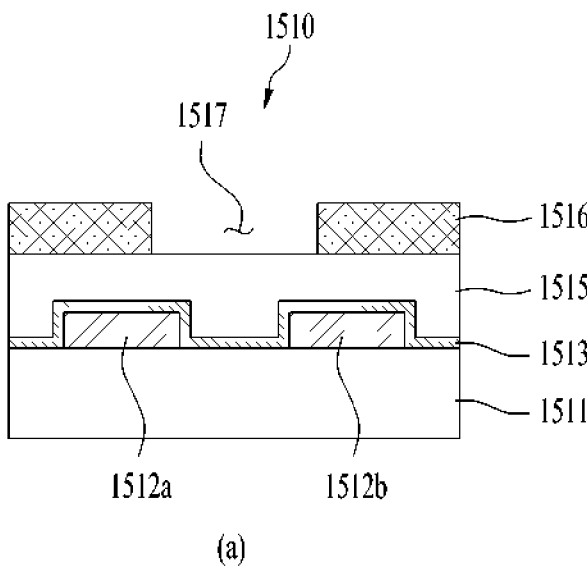
(a)
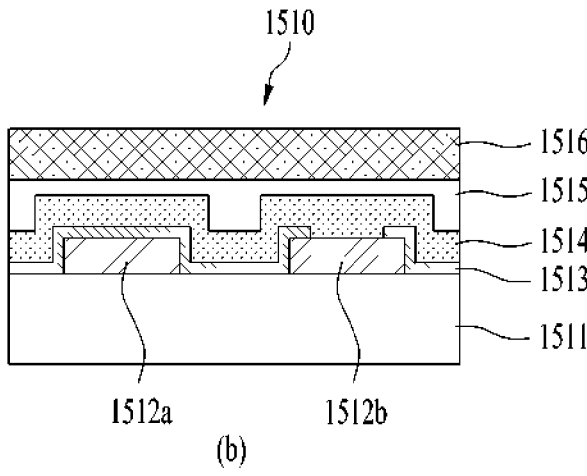
(b)

FIG. 20
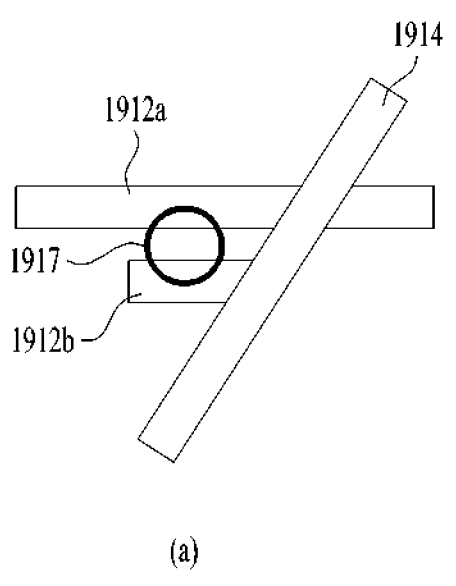
(a)
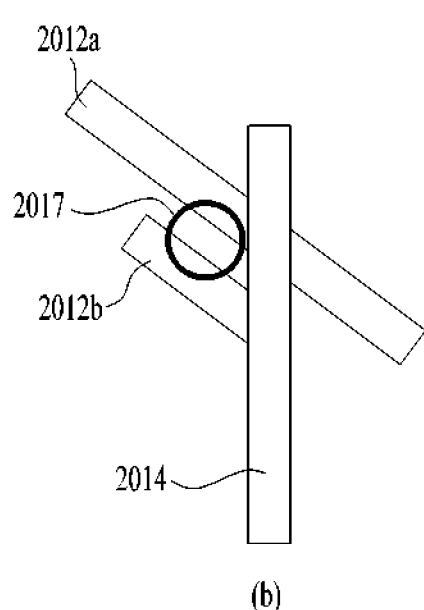
(b)

FIG. 22
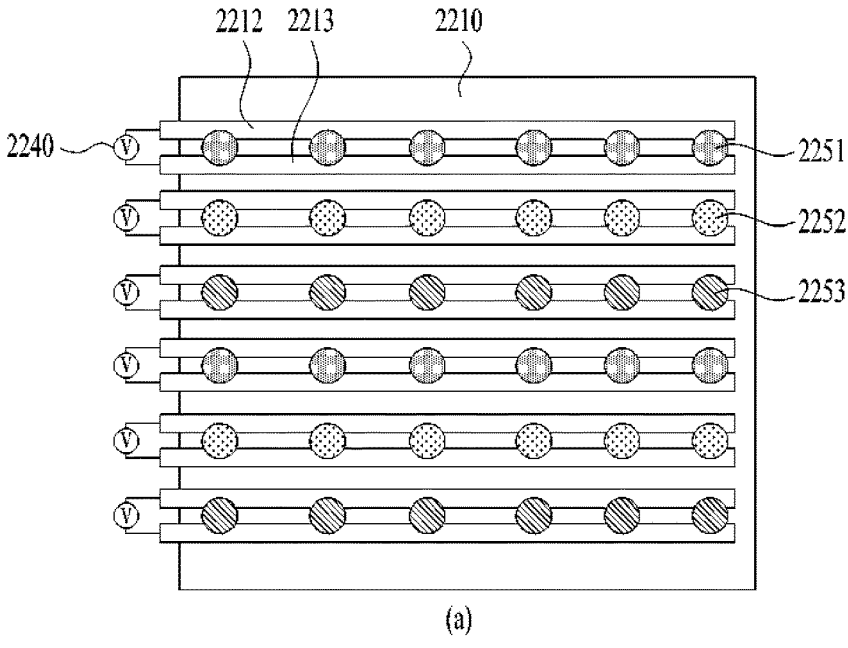
(a)
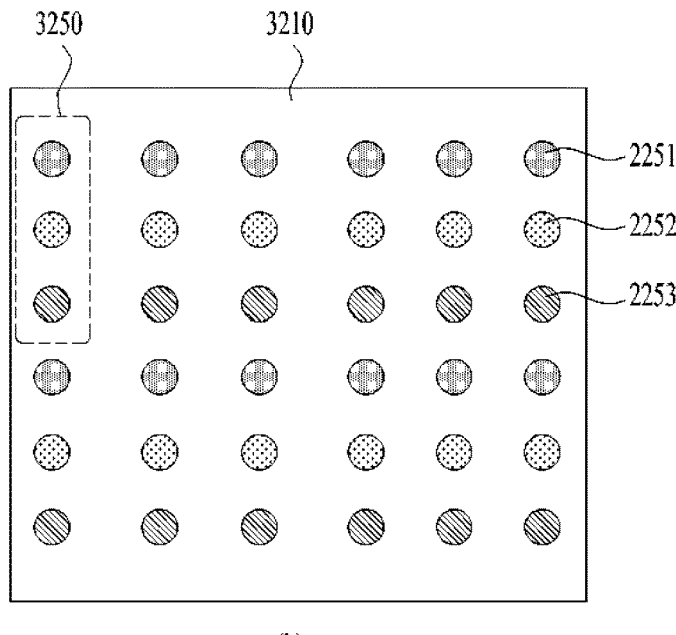
(b)

(a)

(b)

FIG. 24
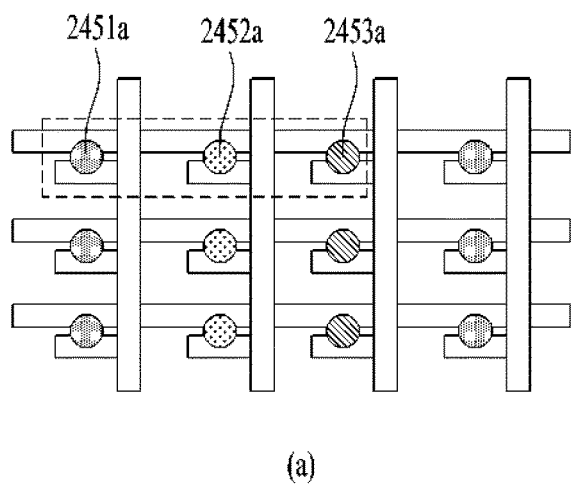
(a)
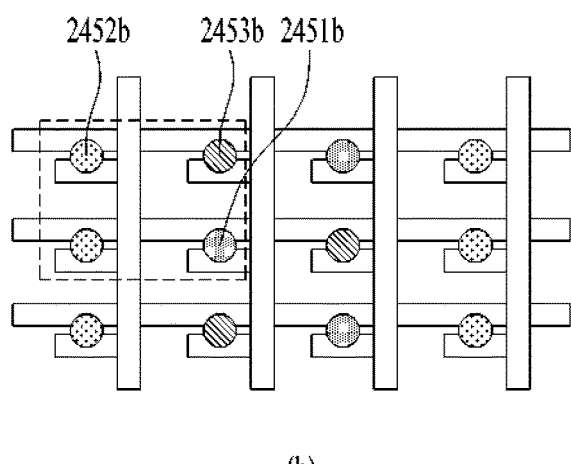
(b)
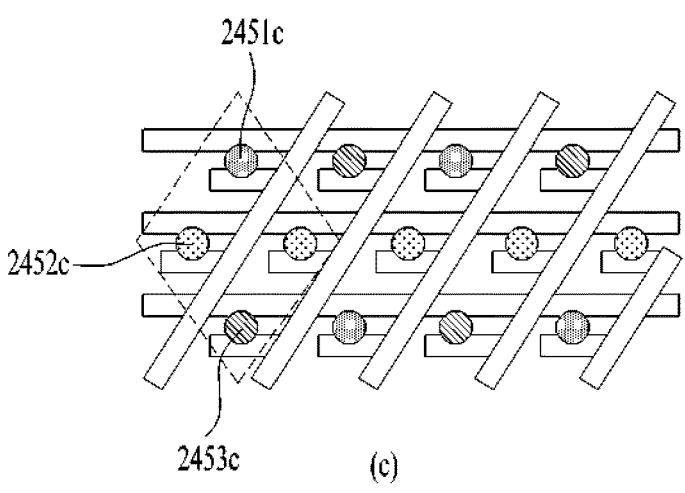
(c)

(a)

(b)

(c)

DISPLAY DEVICE USING MICRO-LEDS AND METHOD FOR MANUFACTURING SAME

CROSS REFERENCE TO RELATED APPLICATIONS

This application is the National Stage filing under 35 U.S.C. 371 of International Application No. PCT/KR2019/012893, filed on Oct. 2, 2019, which claims the benefit of earlier filing date and right of priority to Korean Application No. 10-2019-0121374, filed on Oct. 1, 2019, the entire contents of all these applications are hereby expressly incorporated by reference into the present application.

TECHNICAL FIELD

The present disclosure relates to technology related to a display device, and more particularly to a method for manufacturing a display device using a micro-light emitting diode (micro-LED) and a substrate used in manufacturing the display device.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using such semiconductor light emitting elements, a very large number of semiconductor light emitting elements must be mounted on a substrate. Recently, a pick & place method using a transfer substrate or methods for assembling the semiconductor light emitting elements on the substrate in a fluid are being studied.

The present disclosure discloses a display device, in which a semiconductor light emitting element is assembled to a specific portion of a substrate in a fluid, and a method of manufacturing the same.

DISCLOSURE

Technical Task

An object of an embodiment of the present disclosure is to provide a display device and a method for manufacturing the same using a semiconductor light emitting element.

Another object of an embodiment of the present disclosure is to provide a display device using a new type of assembly substrate configured to allow a semiconductor light emitting element to be assembled to a specific portion of the substrate in a fluid.

Still another object of an embodiment of the present disclosure is to provide a method of repairing a region in a substrate, in which defective assembly occurred, using the assembly substrate as a repair substrate.

Further, another object of the present disclosure is to solve various problems not mentioned herein. Those skilled in the art will appreciate the embodiments of the present disclosure through the description and drawings to be described later.

Technical Solutions

In order to accomplish the above objects, a display device using a semiconductor light emitting element comprises a substrate, a first assembly electrode located on the substrate, a first insulating layer located on the first assembly electrode, a second assembly electrode located on the first insulating layer and electrically connected to a part of the first assembly electrode exposed through an etched portion of the first insulating layer, a second insulating layer located on the second assembly electrode, a barrier rib located on the second insulating layer to define an assembly groove to receive therein a semiconductor light emitting element forming an individual pixel, and a semiconductor light emitting element mounted onto an assembly surface of the assembly groove.

According to an embodiment, the first assembly electrode may be oriented in a first direction, and the second assembly electrode may be oriented in a second direction intersecting the first direction.

According to an embodiment, the first assembly electrode may include a pair of electrodes oriented horizontally in the first direction, and the pair of electrodes may include a working electrode configured to receive an assembly voltage applied thereto and a reference electrode configured to receive a ground voltage applied thereto.

According to an embodiment, the second assembly electrode may be electrically connected to the reference electrode.

According to an embodiment, the working electrode may be disposed on the substrate in the shape of a long bar, and the reference electrode may be provided in a plurality thereof, and the plurality of reference electrodes may be disposed in the shape of short bars so as to correspond to the long bar of the working electrode.

According to an embodiment, the second assembly electrode may be electrically connected to the working electrode.

According to an embodiment, the reference electrode may be disposed on the substrate in the shape of a long bar, and the working electrode may be provided in a plurality thereof, and the plurality of working electrodes may be disposed in the shape of short bars so as to correspond to the long bar of the reference electrode.

According to an embodiment, the first direction and the second direction may be perpendicular to each other.

According to an embodiment, the assembly groove may be located so as to overlap the working electrode and the reference electrode.

A method of manufacturing a display device using a semiconductor light emitting element according to another embodiment of the present disclosure includes separating a plurality of semiconductor light emitting elements on a first substrate from the first substrate, preparing a second substrate including a first assembly electrode and a second assembly electrode intersecting the first assembly electrode, and assembling the plurality of semiconductor light emitting elements to the second substrate using an electric field and a magnetic field by dispersing the plurality of semiconductor light emitting elements in a fluid.

According to an embodiment, the preparing a second substrate may include forming the first assembly electrode on a substrate, forming a first insulating layer on the first assembly electrode, forming the second assembly electrode on the first insulating layer so as to be electrically connected to a part of the first assembly electrode exposed by etching a portion of the first insulating layer, forming a second insulating layer on the second assembly electrode, and forming a barrier rib on the second insulating layer to define a plurality of assembly grooves to receive therein semiconductor light emitting elements forming individual pixels.

According to an embodiment, the first assembly electrode may include a working electrode and a reference electrode oriented horizontally in a first direction, and the assembling the plurality of semiconductor light emitting elements to the second substrate may include applying an assembly voltage to the working electrode and applying a ground voltage to the reference electrode.

According to an embodiment, the working electrode may be disposed on the substrate in the shape of a long bar, and the reference electrode may be provided in a plurality thereof, and the plurality of reference electrodes may be disposed in the shape of short bars so as to correspond to the long bar of the working electrode.

According to an embodiment, the assembly grooves may be located so as to overlap the working electrode and the reference electrode.

According to an embodiment, the assembling the plurality of semiconductor light emitting elements to the second substrate may include, when a semiconductor light emitting element is not mounted into any of the plurality of assembly grooves, applying an assembly voltage to the working electrode and applying a ground voltage to a second assembly electrode corresponding to an assembly groove having no semiconductor light emitting element mounted therein.

According to an embodiment, the method may further include, after the assembling the plurality of semiconductor light emitting elements to the second substrate, transferring the plurality of semiconductor light emitting elements onto a third substrate including a transistor for driving of an active matrix.

According to an embodiment, the method may further include, when a semiconductor light emitting element is not transferred onto a specific point in the third substrate, assembling a semiconductor light emitting element corresponding to the specific point to the second substrate and transferring the semiconductor light emitting element assembled to the second substrate onto the third substrate.

According to an embodiment, the first substrate may be a growth substrate configured to form the semiconductor light emitting elements thereon or a transfer substrate configured to receive the semiconductor light emitting elements transferred thereto from the growth substrate.

Advantageous Effects

According to one embodiment of the present disclosure, it is possible to provide a display device and a method for manufacturing the same using a semiconductor light emitting element.

Specifically, an assembly substrate, which includes first assembly electrodes and second assembly electrodes intersecting the first assembly electrodes, may be used to mount semiconductor light emitting elements at intersection points of the assembly electrodes. Accordingly, a plurality of semiconductor light emitting elements may be arranged in any of various patterns at specific positions in the substrate.

In addition, it is possible to repair a region in a substrate in which defective assembly occurred using the assembly substrate as a repair substrate after assembly or transfer of semiconductor light emitting elements.

Further, according to another embodiment of the present disclosure, there are additional technical effects not mentioned here. Those skilled in the art can understand the present disclosure through the purposes of the specification and drawings.

DESCRIPTION OF DRAWINGS

FIGS. 3A and 3B are cross-sectional diagrams taken along the cutting lines B-B and C-C in FIG. 2, respectively.

FIG. 7 is a perspective diagram of a display device using a semiconductor light emitting element according to another embodiment of the present disclosure.

FIG. 8 is a cross-sectional diagram taken along a cutting line D-D shown in FIG. 7.

FIG. 13 is a flowchart showing a method of manufacturing a display device using a semiconductor light emitting element and an assembly substrate of the present disclosure.

FIG. 14 is a flowchart showing a method of manufacturing the assembly substrate according to the present disclosure.

FIG. 16 is a cross-sectional view showing a method of manufacturing the assembly substrate according to the present disclosure.

FIGS. 17 and 18 are views showing the cross-section of a specific portion of the assembly substrate.

FIG. 20 illustrates various embodiments of the assembly substrate according to the present disclosure.

FIG. 22 illustrates diagrams showing semiconductor light emitting elements assembled to a general assembly substrate and semiconductor light emitting elements transferred onto a wiring substrate.

FIG. 24 illustrates various embodiments of arrangements in which semiconductor light emitting elements are assembled to the assembly substrate of the present disclosure.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
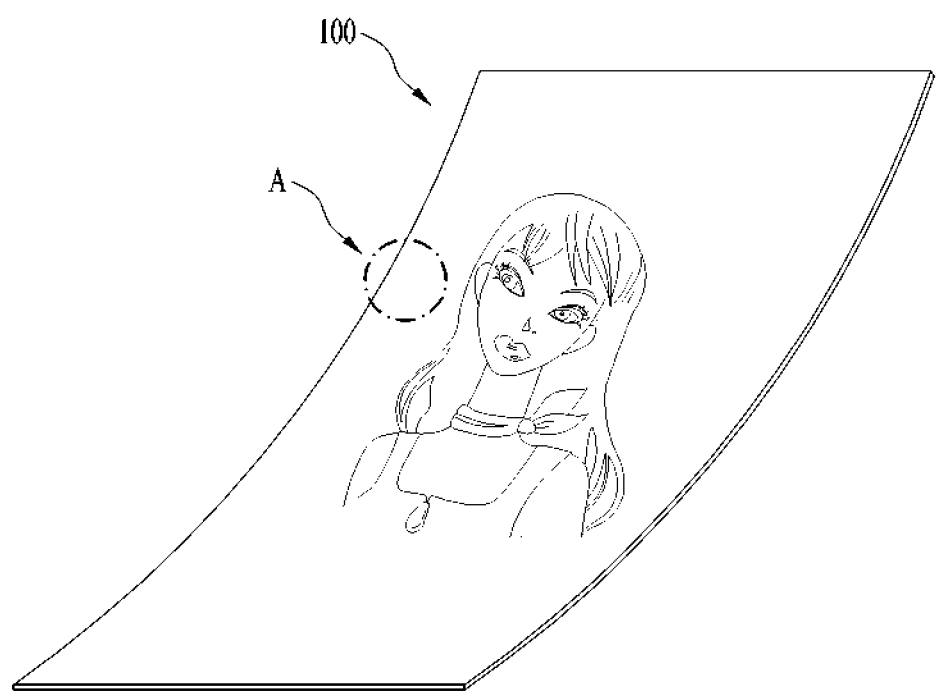
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
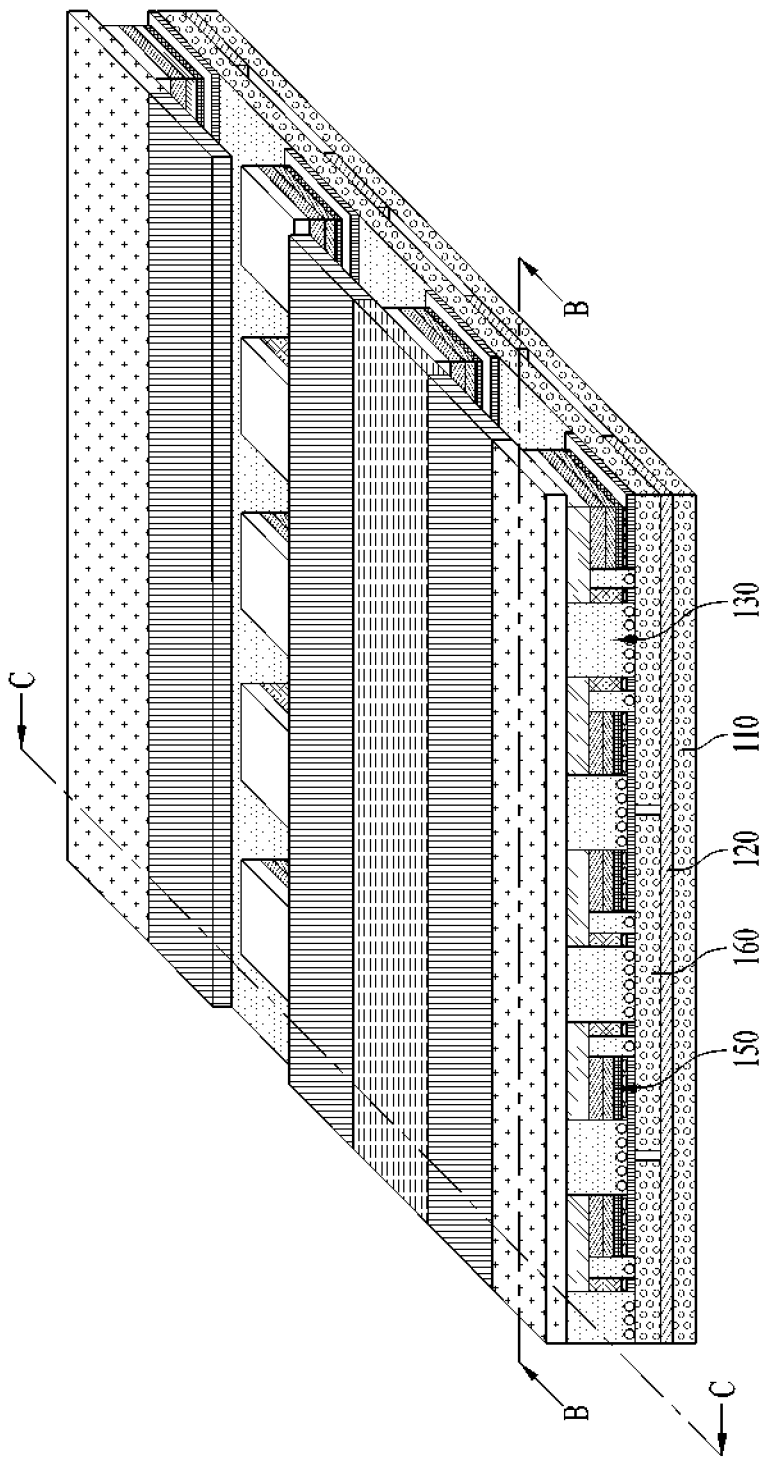
FIG. 2 is a partially enlarged diagram showing a part A shown in FIG. 1.

FIG. 2 is a partially enlarged view showing part A of FIG. 1.

Figure 3A:
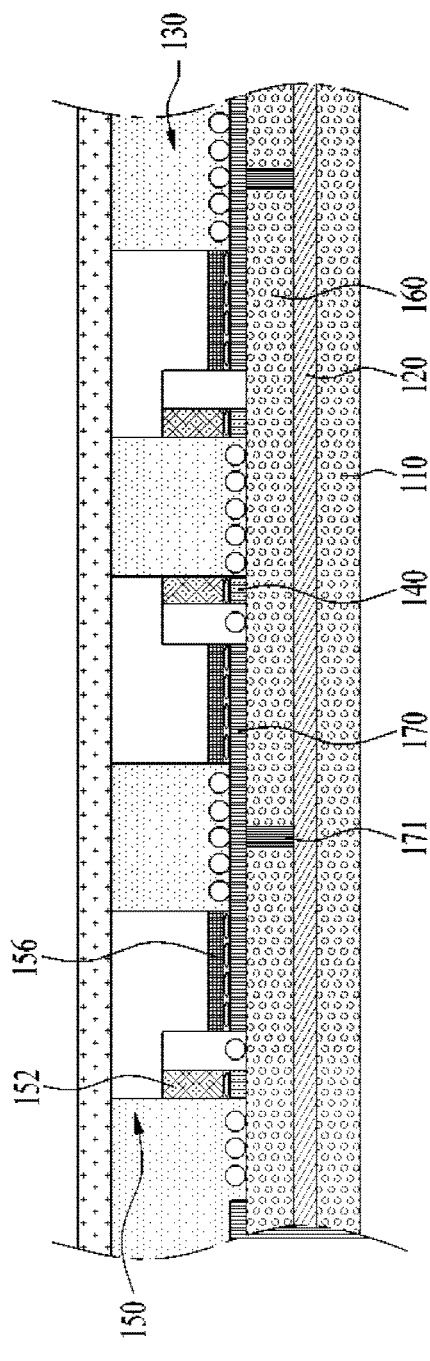
Figure 3B:
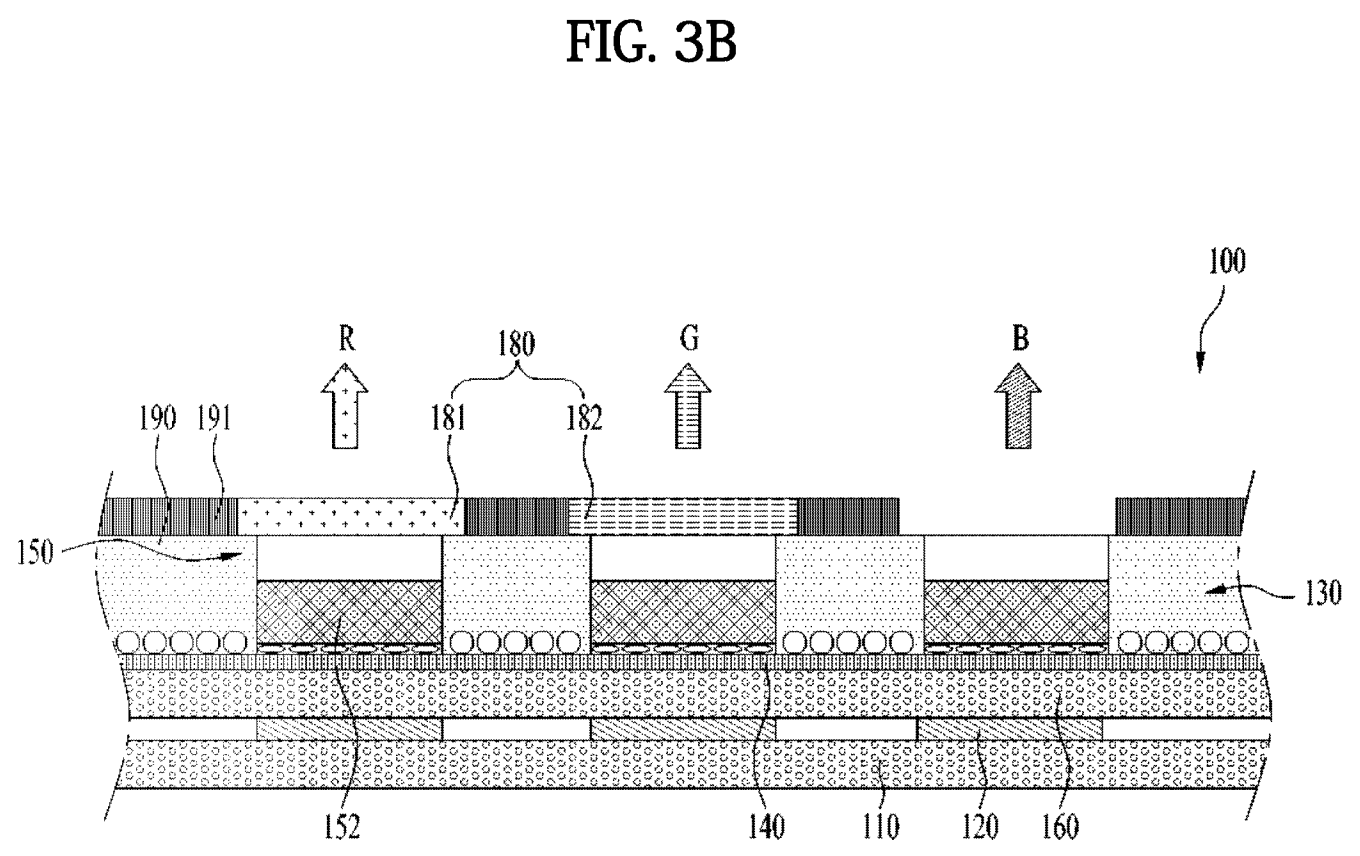

FIGS. 3A and 3B are cross-sectional views taken along lines B-B and C-C in FIG. 2, respectively.

Figure 4:
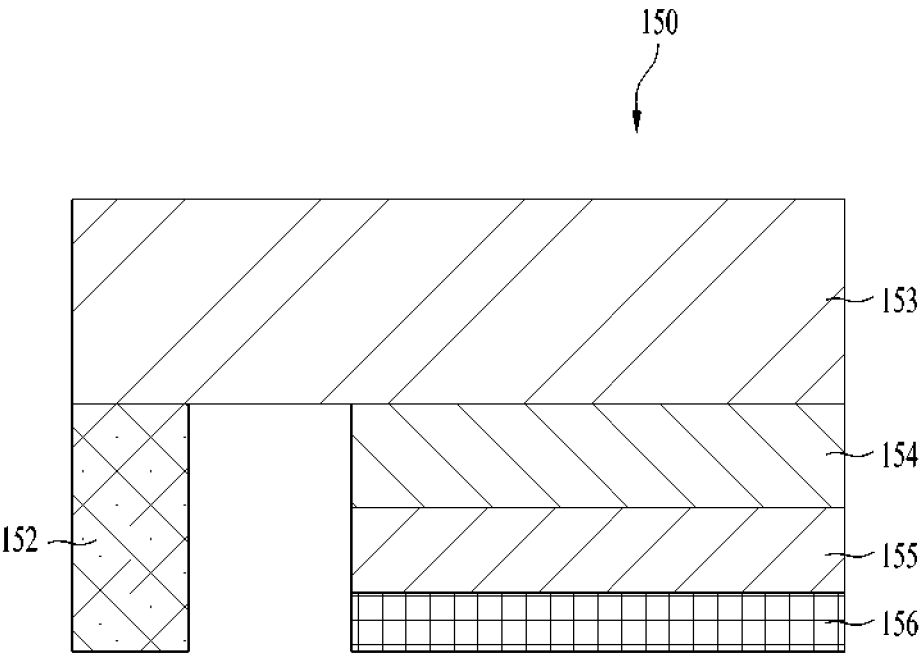
FIG. 4 is a conceptual diagram illustrating the flip-chip type semiconductor light emitting element of FIGS. 3A and 3B.

FIG. 4 is a conceptual diagram illustrating the flip-chip type semiconductor light emitting element of FIGS. 3A and 3B (also collectively referred to below as FIG. 3).

Figure 5A:
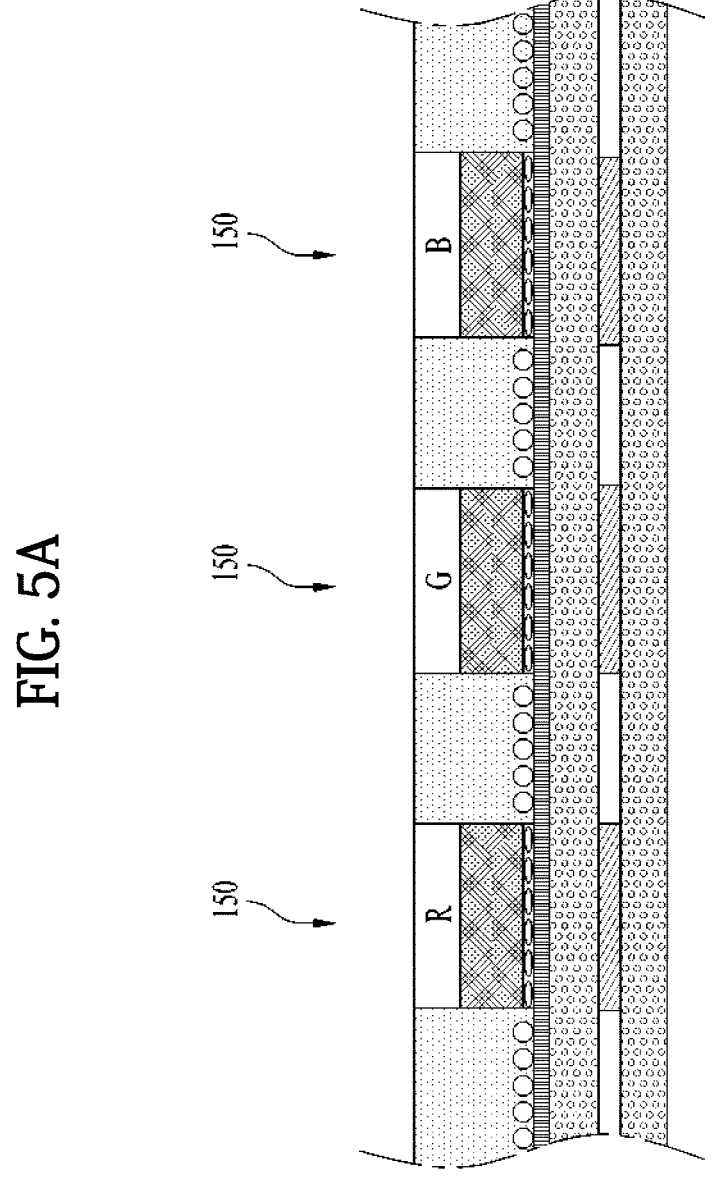
FIGS. 5A to 5C are conceptual diagrams illustrating various examples of color implementation with respect to a flip-chip type semiconductor light emitting element.
Figure 5B:
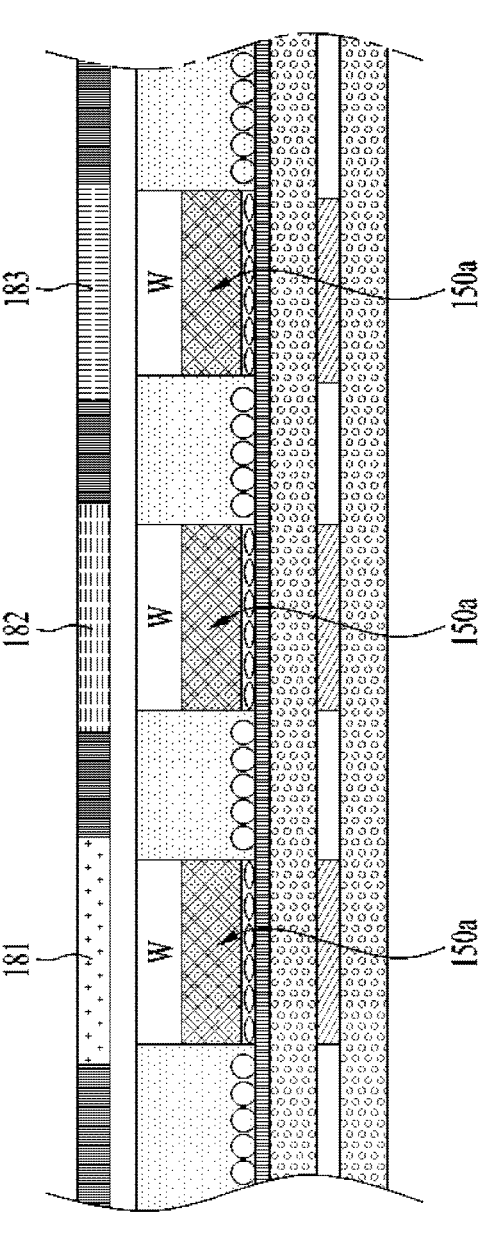
Figure 5C:
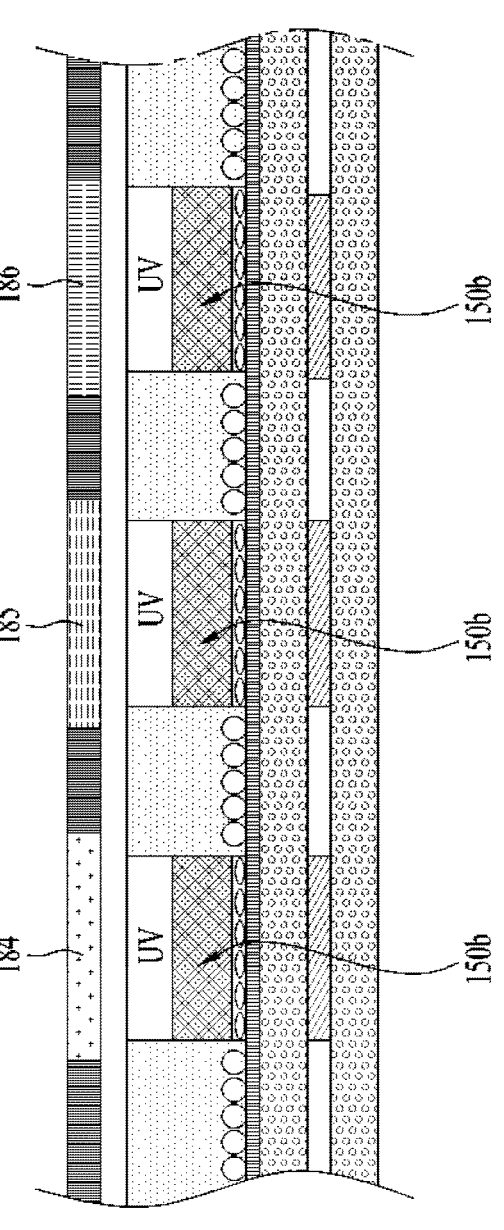

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 184, a green phosphor conversion layer 185, and a blue phosphor conversion layer 186 may be provided on a ultraviolet light emitting device 150b. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
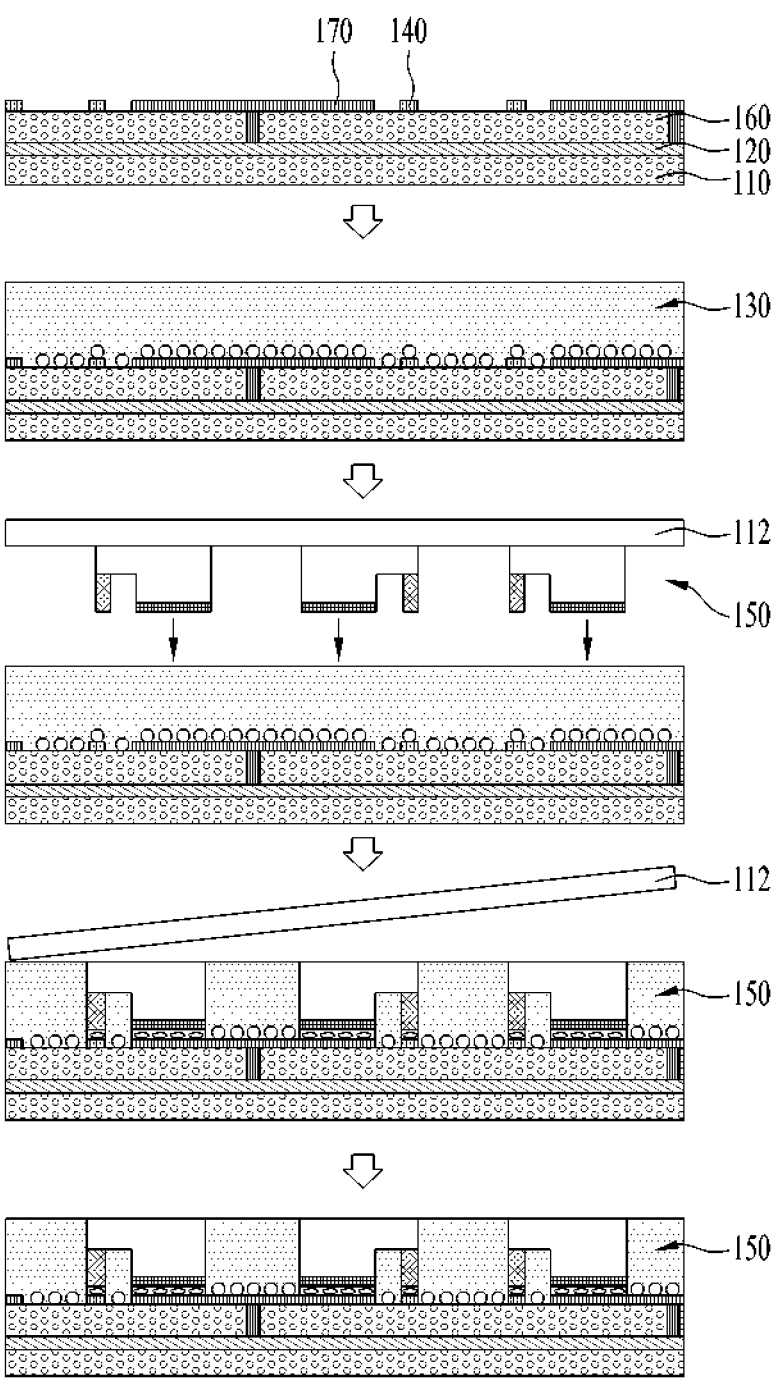
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
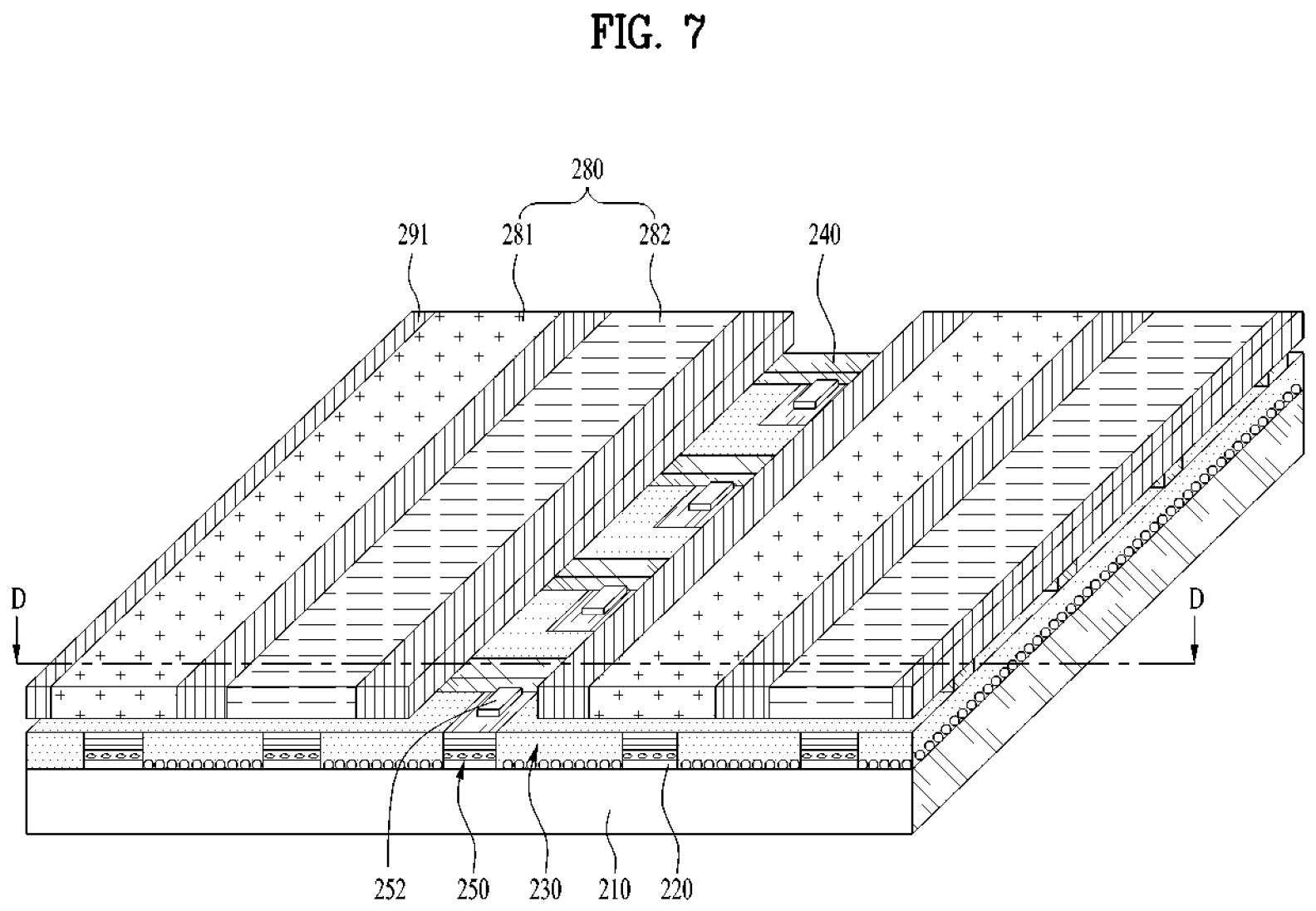
Figure 8:
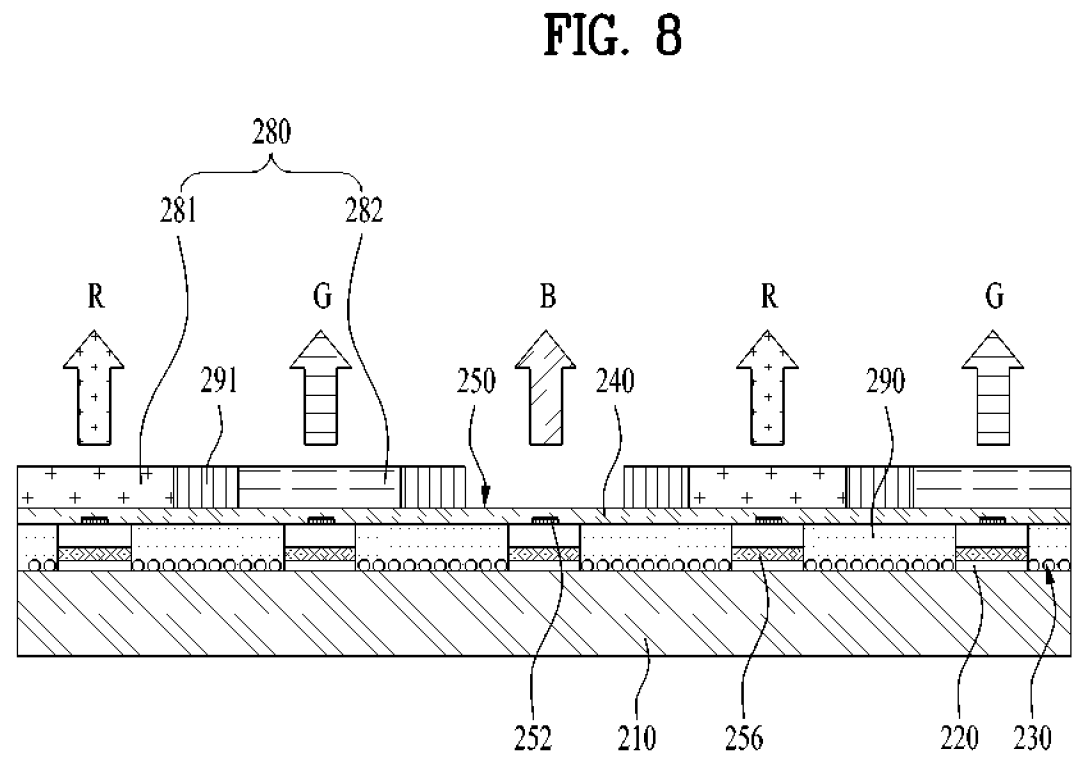
Figure 9:
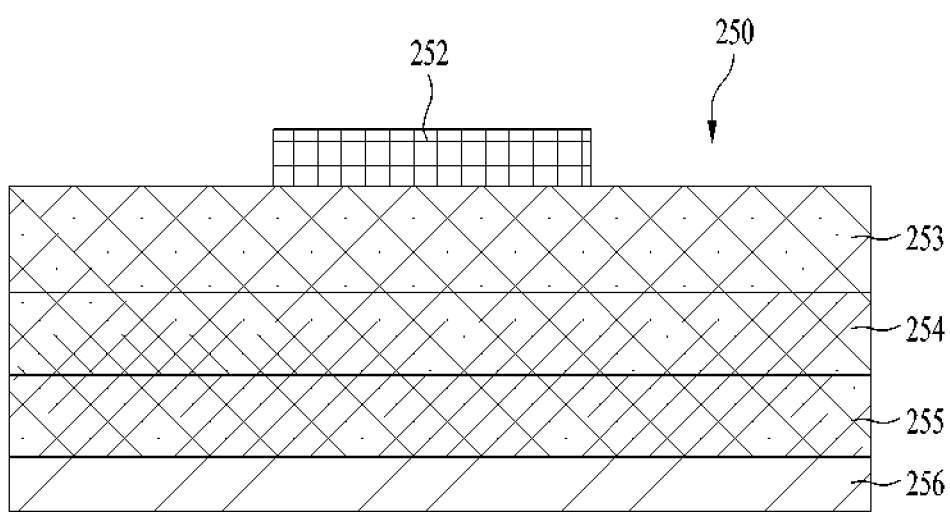
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 7, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
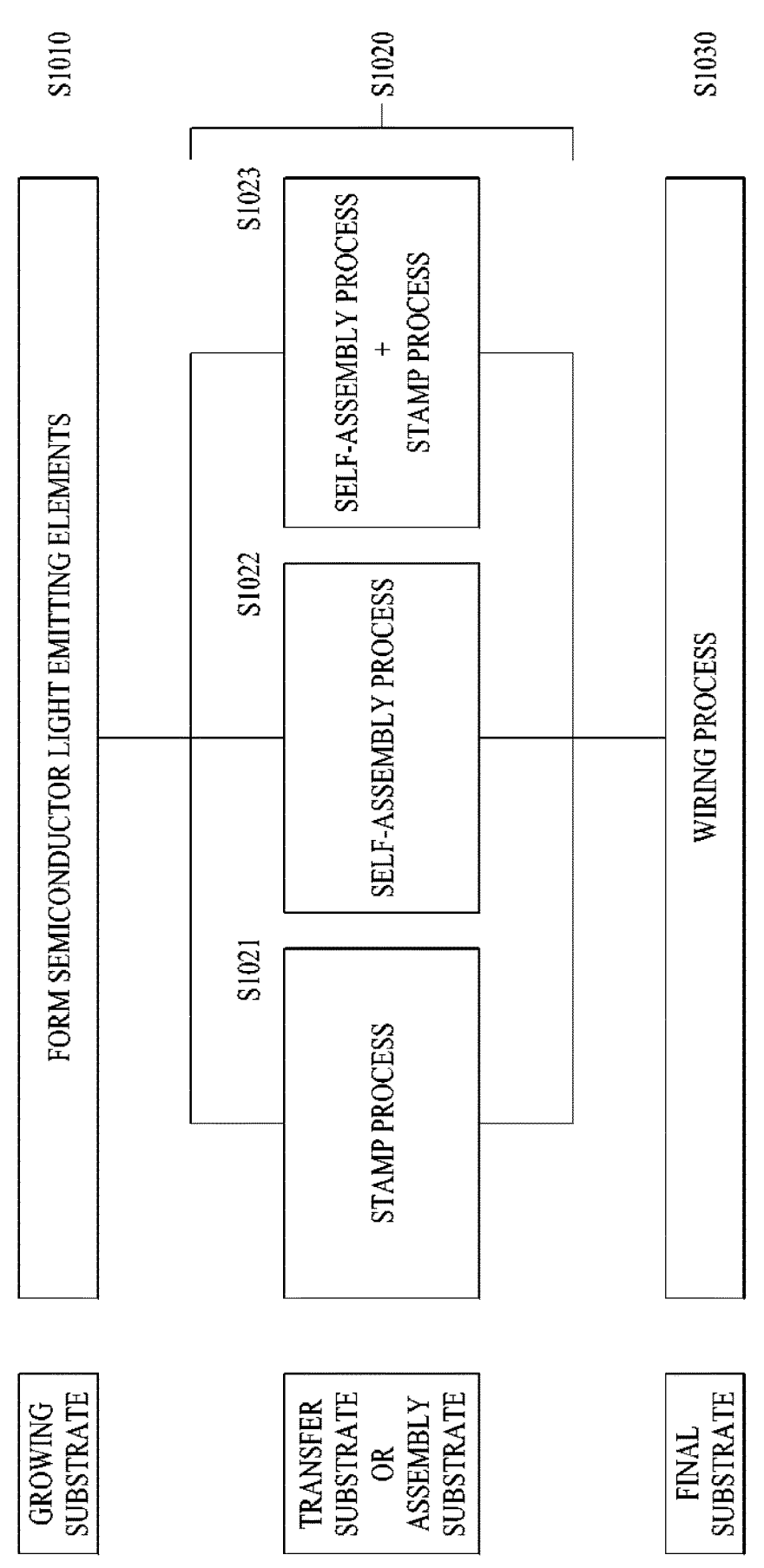
FIG. 10 is a diagram schematically illustrating a method for manufacturing a display device using a semiconductor light emitting element.

FIG. 10 is a diagram schematically illustrating a method for manufacturing a display device using a semiconductor light emitting element.

First, the semiconductor light emitting elements are formed on the growing substrate (S1010). The semiconductor light emitting elements may include a first conductivity type semiconductor layer, an active layer, and a second conductivity type semiconductor layer. In addition, a first conductivity type electrode formed on the first conductivity type semiconductor layer and a second conductivity type electrode formed on the second conductivity type semiconductor layer may be further included.

The semiconductor light emitting elements may be a horizontal type semiconductor light emitting element or the vertical type semiconductor light emitting element. However, in the case of the vertical type semiconductor light emitting element, because the first conductivity type electrode and the second conductivity type electrode face each other, a process of separating the semiconductor light emitting element from the growing substrate and forming a conductivity type electrode in one direction is added in a subsequent process. In addition, as will be described later, the semiconductor light emitting element may include a magnetic layer for a self-assembly process.

In order to utilize the semiconductor light emitting elements in the display device, in general, three types of semiconductor light emitting elements that emit light of colors corresponding to red (R), green (G), and blue (B) are required. Because semiconductor light emitting elements emitting light of one color are formed on one growing substrate, a separate substrate is required for the display device that implements individual unit pixels using the three types of semiconductor light emitting elements. Therefore, individual semiconductor light emitting elements must be separated from the growing substrate and assembled or transferred onto a final substrate. The final substrate is a substrate on which a process of forming a wiring electrode for applying a voltage to the semiconductor light emitting element such that the semiconductor light emitting element may emit light is performed.

Therefore, the semiconductor light emitting elements emitting the light of the respective colors may be transferred back to the final substrate after moving to the transfer substrate or the assembly substrate (S1020). In some cases, when performing the wiring process directly on the transfer substrate or the assembly substrate, the transfer substrate or the assembly substrate serves as the final substrate.

The method (S1020) for disposing the semiconductor light emitting element on the transfer substrate or the assembly substrate may be roughly divided into three types.

A first type is a method (S1021) for moving the semiconductor light emitting element from the growing substrate to the transfer substrate by the stamp process. The stamp process refers to a process of separating the semiconductor light emitting element from the growing substrate through a protrusion using a substrate that is made of a flexible material and having the adhesive protrusion. By adjusting a spacing and an arrangement of the protrusions, the semiconductor light emitting element of the growing substrate may be selectively separated.

A second type is a method (S1022) for assembling the semiconductor light emitting element onto the assembly substrate using the self-assembly process. For the self-assembly process, the semiconductor light emitting element must exist independently by being separated from the growing substrate, so that the semiconductor light emitting elements are separated from the growing substrate through a laser lift-off (LLO) process or the like as much as the required number of semiconductor light emitting elements. Thereafter, the semiconductor light emitting elements are dispersed in a fluid and assembled onto the assembly substrate using an electromagnetic field.

The self-assembly process may simultaneously assemble the semiconductor light emitting elements that respectively implement the R, G, and B colors on one assembly substrate, or assemble the semiconductor light emitting element of the individual color through an individual assembly substrate.

A third type is a method (S1023) for mixing the stamp process and the self-assembly process. First, the semiconductor light emitting elements are placed on the assembly substrate through the self-assembly process, and then the semiconductor light emitting elements are moved to the final substrate through the stamp process. In the case of the assembly substrate, because it is difficult to implement the assembly substrate in a large area due to a location of the assembly substrate during the self-assembly process, a contact with the fluid, an influence of the electromagnetic fields, or the like, a process of transferring the semiconductor light emitting elements to the final substrate of a large area after assembling the semiconductor light emitting elements using an assembly substrate of an appropriate area may be performed several times with the stamp process.

When a plurality of semiconductor light emitting elements constituting the individual unit pixel are placed on the final substrate, the wiring process for electrically connecting the semiconductor light emitting elements to each other is performed (S1030).

The wiring electrode formed through the wiring process electrically connects the semiconductor light emitting elements assembled or transferred onto the substrate to the substrate. In addition, a transistor for driving an active matrix may be previously formed beneath the substrate. Accordingly, the wiring electrode may be electrically connected to the transistor.

In one example, innumerable semiconductor light emitting elements are required for a large-area display device, so that the self-assembly process is preferable. In order to further improve an assembly speed, among the self-assembly processes, it may be preferred that the semiconductor light emitting elements of the respective colors are simultaneously assembled onto one assembly substrate. In addition, in order for the semiconductor light emitting elements of the respective colors to be assembled at predetermined specific positions on the assembly substrate, it may be required for the semiconductor light emitting elements to have a mutually exclusive structure.

Figure 11:
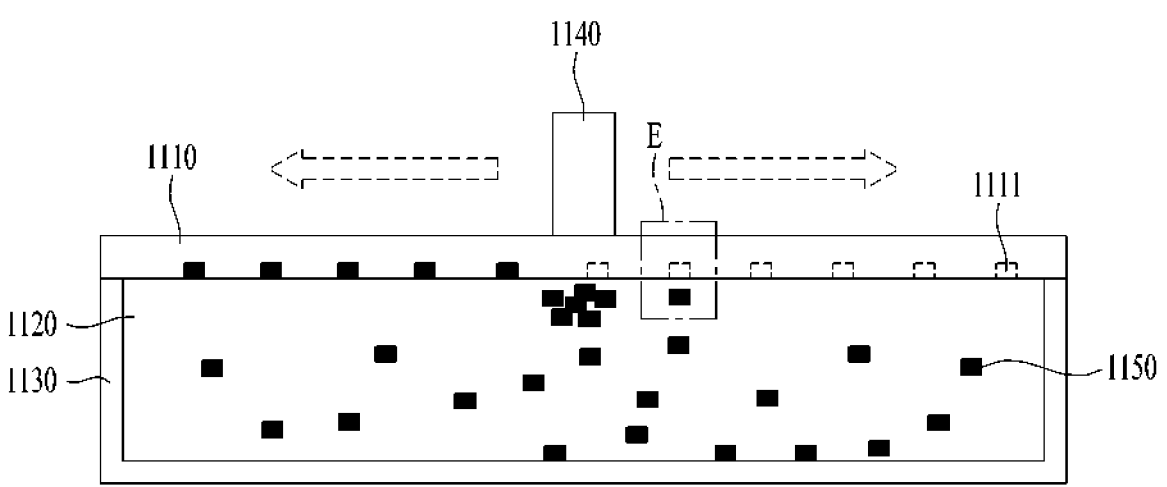
FIG. 11 is a diagram showing one embodiment of a method for assembling a semiconductor light emitting element onto a substrate by a self-assembly process.

FIG. 11 is a diagram showing one embodiment of a method for assembling a semiconductor light emitting element onto a substrate by a self-assembly process.

Figure 12:
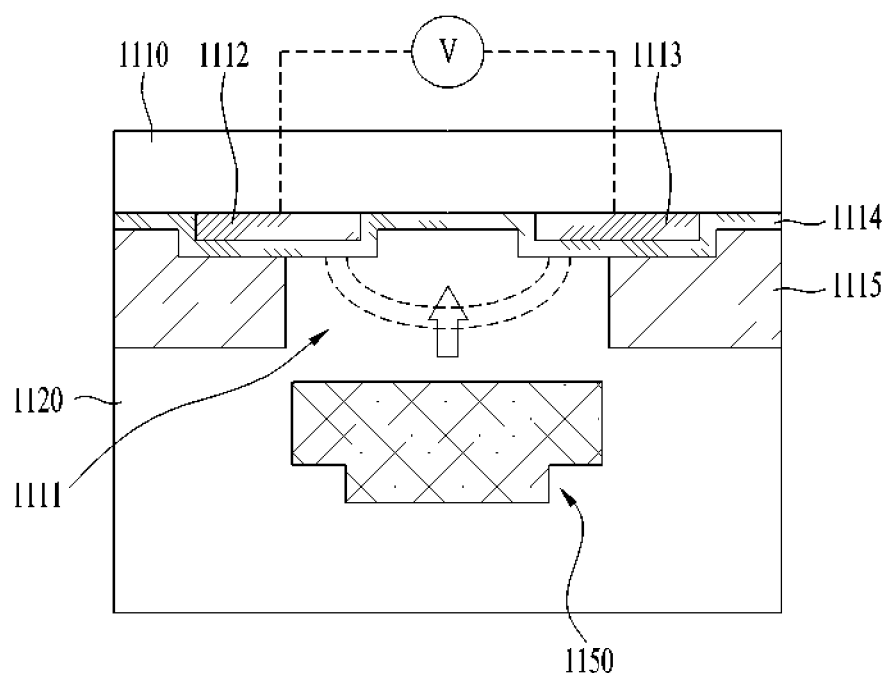
FIG. 12 is an enlarged view of a portion E in FIG. 11.

FIG. 12 is an enlarged view of a portion E in FIG. 11.

Referring to FIGS. 11 and 12, a semiconductor light emitting element 1150 may be input into a chamber 1130 filled with a fluid 1120.

Thereafter, the assembly substrate 1110 may be disposed on the chamber 1130. According to an embodiment, the assembly substrate 1110 may be introduced into the chamber 1130. In this regard, a direction in which the assembly substrate 1110 is introduced is a direction in which an assembly groove 1111 of the assembly substrate 1110 faces the fluid 1120.

A pair of electrodes 1112 and 1113 corresponding to each semiconductor light emitting element 1150 to be assembled may be formed on the assembly substrate 1110. The electrodes 1112 and 1113 may be implemented as transparent electrodes (ITO) or may be implemented using other common materials. The electrodes 1112 and 1113 correspond to assembly electrodes that stably fix the semiconductor light emitting element 1150 in contact with the assembly electrodes 1112 and 1113 by generating an electric field as a voltage is applied thereto.

Specifically, an alternating voltage may be applied to the electrodes 1112 and 1113. The semiconductor light emitting element 1150 floating around the electrodes 1112 and 1113 may have a polarity because of dielectric polarization. In addition, the dielectrically polarized semiconductor light emitting element may move in a specific direction or may be fixed by a non-uniform electric field formed around the electrodes 1112 and 1113. This is referred to as dielectrophoresis (DEP). In the self-assembly process of the present disclosure, the semiconductor light emitting element 1150 may be stably fixed into the assembly groove 1111 using the dielectrophoresis. An intensity of the dielectrophoresis (a dielectrophoretic force, DEP force) is proportional to an intensity of the electric field, and varies depending on a degree of dielectric polarization in the semiconductor light emitting element.

In addition, a gap between the assembly electrodes 1112 and 1113 is smaller than, for example, a width of the semiconductor light emitting element 1150 and a diameter of the assembly groove 1111, so that an assembly position of the semiconductor light emitting element 1150 using the electric field may be more precisely fixed.

In addition, the insulating layer 1114 is formed on the assembly electrodes 1112 and 1113 to protect the electrodes 1112 and 1113 from the fluid 1120 and prevent leakage of current flowing through the assembly electrodes 1112 and 1113. For example, the insulating layer 1114 may be formed of a single layer or multiple layers of an inorganic insulator such as silica or alumina or an organic insulator. In addition, the insulating layer 1114 may have a minimum thickness for preventing damage to the assembly electrodes 1112 and 1113 when assembling the semiconductor light emitting element 1150, and may have a maximum thickness for stably assembling the semiconductor light emitting element 1150.

A partition wall 1115 may be formed on top of the insulating layer 1114. A partial region of the partition wall 1115 may be positioned on top of each of the assembly electrodes 1112 and 1113, and the remaining region thereof may be positioned on top of the assembly substrate 1110.

For example, when manufacturing the assembly substrate 1110, as a portion of the partition wall formed on top of an entirety of the insulating layer 1114 is removed, the assembly groove 1111 in which each semiconductor light emitting element 1150 is coupled to the assembly substrate 1110 may be defined.

As shown in FIG. 12, the assembly groove 1111 into which the semiconductor light emitting element 1150 is coupled is defined in the assembly substrate 1110, and the surface in which the assembly groove 1111 is defined may be in contact with the fluid 1120. The assembly groove 1111 may guide the accurate assembly position of the semiconductor light emitting element 1150.

In addition, the partition wall 1115 may be formed with a constant inclination in a direction from an opening to a bottom surface of the assembly groove 1111. For example, by adjusting the inclination of the partition wall 1115, the assembly groove 1111 may have the opening and the bottom surface, and an area of the opening may be larger than an area of the bottom surface. Accordingly, the semiconductor light emitting element 1150 may be assembled at an accurate position on the bottom surface of the assembly groove 1111.

In one example, the assembly groove 1111 may have a shape and a size corresponding to a shape of the semiconductor light emitting element 1150 to be assembled. Accordingly, assembly of another semiconductor light emitting element or a plurality of semiconductor light emitting elements into the assembly groove 1111 may be prevented.

In addition, a depth of the assembly groove 1111 may be smaller than a vertical height of the semiconductor light emitting element 1150. Therefore, the semiconductor light emitting element 1150 may have a structure that protrudes between the partition walls 1115 and may easily come into contact with the protrusion of the transfer substrate during the transfer process that may occur after the assembly.

In addition, as shown in FIG. 12, after the assembly substrate 1110 is disposed, an assembly apparatus 1140 including a magnetic body may move along the assembly substrate 1110. The assembly apparatus 1140 may be moved while in contact with the assembly substrate 1110 in order to maximize a region to which the magnetic field is applied into the fluid 1120. For example, the assembly apparatus 1140 may include a plurality of magnetic bodies, or may include a magnetic body having a size corresponding to that of the assembly substrate 1110. In this case, a moving distance of the assembly apparatus 1140 may be limited within a predetermined range.

By a magnetic field generated by the assembly apparatus 1140, the semiconductor light emitting element 1150 in the chamber 1130 may move toward the assembly apparatus 1140.

While moving toward the assembly apparatus 1140, the semiconductor light emitting element 1150 may enter the assembly groove 1111 and come into contact with the assembly substrate 1110 as shown in FIG. 12.

In addition, the semiconductor light emitting element 1150 may include a magnetic layer therein such that the self-assembly process may be performed.

In one example, due to the electric field generated by the assembly electrodes 1112 and 1113 of the assembly substrate 1110, the semiconductor light emitting element 1150 in contact with the assembly substrate 1110 may be prevented from deviating by the movement of the assembly apparatus 1140.

Therefore, by the self-assembly scheme using the electromagnetic field shown in FIGS. 11 and 12, the plurality of semiconductor light emitting elements 1150 are simultaneously assembled onto the assembly substrate 1110.

FIG. 13 is a flowchart showing a method of manufacturing a display device using a semiconductor light emitting element and an assembly substrate of the present disclosure.

First, semiconductor light emitting elements on a first substrate are separated from the first substrate (S1310). The first substrate may be a growth substrate on which semiconductor light emitting elements are formed or a transfer substrate onto which the semiconductor light emitting elements are transferred from the growth substrate. When the first substrate is a growth substrate, as described above, the semiconductor light emitting elements may be selectively separated from the growth substrate through a laser lift-off (LLO) method. Alternatively, when the first substrate is a transfer substrate, the semiconductor light emitting elements may generally be separated from the transfer substrate through chemical etching.

Thereafter, a second substrate, which includes first assembly electrodes and second assembly electrodes intersecting the first assembly electrodes, is prepared (S1320). In this case, the first assembly electrodes are oriented in a first direction, and the second assembly electrodes are oriented in a second direction intersecting the first direction. In addition, the first assembly electrodes may include a pair of electrodes oriented horizontally in the first direction. Furthermore, the pair of electrodes includes a working electrode to which an assembly voltage is applied and a reference electrode to which a ground voltage is applied. As will be described later, one of the working electrode and the assembly electrode is electrically connected to the second assembly electrodes. In addition, one of the first assembly electrodes may be disposed on the substrate in the shape of a long bar in the first direction, and the other may be formed in the shape of a short bar, and a plurality of short bars may be disposed in a direction parallel to the long bar.

Thereafter, the semiconductor light emitting elements separated from the first substrate are dispersed in a fluid, and are assembled to the second substrate using an electric field and a magnetic field (S1330). The second substrate corresponds to an assembly substrate, and the assembly method in the assembly step S1330 is similar to the self-assembly method described above with reference to FIGS. 11 and 12. However, since the assembly electrodes intersecting each other are additionally formed on the assembly substrate, there is a difference with regard to the method of applying voltages, and when an assembly defect occurs in a particular region, the assembly defect may be repaired.

After the assembly step (S1330), the assembly substrate may be directly utilized as a panel of a display device using the semiconductor light emitting elements assembled to the assembly substrate. In this case, a separate wiring process may be performed on the semiconductor light emitting elements. Further, the assembly substrate may be a wiring substrate having formed thereon a transistor for driving an active matrix.

Meanwhile, the area of the assembly substrate is limited due to the characteristics of assembly of the semiconductor light emitting elements in a fluid. For example, in the case of a 20-inch substrate, semiconductor light emitting elements may be stably assembled to the substrate in a fluid, whereas in the case of a 60-inch substrate, it is difficult to stably assemble semiconductor light emitting elements to the substrate in a fluid. The reason for this is that, when a substrate having a large area, such as a 60-inch substrate, is located on the upper surface of the chamber, as shown in FIG. 11, warpage may occur due to the weight of the substrate. Accordingly, the force that is applied to the semiconductor light emitting elements due to an electric field and a magnetic field may vary, and the semiconductor light emitting elements may not be properly assembled to specific portions of the substrate. Thus, the size of the assembly substrate may be limited, and a separate wiring substrate having a large area may be provided in order to realize a display device having a large area.

Therefore, the semiconductor light emitting elements assembled to the second substrate, which is the assembly substrate, may optionally be transferred onto a third substrate (S1340). The third substrate may be a wiring substrate provided with a transistor for driving an active matrix.

Meanwhile, the number of semiconductor light emitting elements to be assembled to the assembly substrate may be millions or more. The assembly substrate has assembly grooves formed therein so as to correspond to the semiconductor light emitting elements, and the semiconductor light emitting elements are mounted in the assembly grooves in the assembly step S1330. In some cases, some of the semiconductor light emitting elements may not be assembled into corresponding assembly grooves. If the semiconductor light emitting elements are transferred onto the third substrate in the state in which some of the semiconductor light emitting elements are not mounted in corresponding assembly grooves, the display device manufactured using the third substrate may have defective pixels. For example, even if millions of semiconductor light emitting elements are properly located, if only a few semiconductor light emitting elements are defective or are not located at designated positions on the substrate, the display device is not commercially acceptable. Therefore, when it is ascertained that the third substrate has a defective region, the defective region subsequently needs to be repaired.

Therefore, when some of the semiconductor light emitting elements are defectively transferred onto the third substrate, the semiconductor light emitting elements may optionally be re-transferred onto the third substrate using the second substrate as a repair substrate (S1350). Due to the intersecting assembly electrodes on the second substrate, a semiconductor light emitting element may be individually assembled to the assembly substrate at a designated position corresponding to the X-axis and the Y-axis through a passive matrix method. Accordingly, the semiconductor light emitting elements may be assembled to the second substrate only at designated positions, and may then be re-transferred onto the third substrate.

Meanwhile, it will be apparent to those skilled in the art that omission of or changes in some steps in the flowchart shown in FIG. 13 falls within the scope of the present disclosure, in consideration of the overall gist of the present disclosure.

FIG. 14 is a flowchart showing a method of manufacturing the assembly substrate according to the present disclosure.

First, first assembly electrodes are formed on a substrate (S1312). The substrate corresponds to a base portion of the assembly substrate. In addition, the substrate may be formed of a light-transmissive material. Accordingly, when the semiconductor light emitting elements assembled to the assembly substrate are transferred onto another substrate, it may be possible to optically align the assembly substrate with the other substrate using an optical camera.

Thereafter, a first insulating layer is formed on the first assembly electrodes (S1322). The first insulating layer serves to protect the first assembly electrodes.

Thereafter, a portion of the first insulating layer is etched to form a via hole through which a part of the first assembly electrodes is exposed. Thereafter, second assembly electrodes are formed on the first insulating layer so as to be electrically connected to one of the first assembly electrodes through the via hole.

Thereafter, a second insulating layer is formed on the second assembly electrodes (S1325). The second insulating layer may protect the second assembly electrodes from the fluid during the assembly process.

Finally, barrier ribs are formed on the second insulating layer in order to define assembly grooves in which the semiconductor light emitting elements forming individual pixels are mounted (S1326). The barrier ribs may be made of the same material as the second insulating layer. Alternatively, the material of the barrier ribs may be a photosensitive photoresist.

Meanwhile, it will be apparent to those skilled in the art that omission of or changes in some steps in the flowchart shown in FIG. 14 falls within the scope of the present disclosure, in consideration of the overall gist of the present disclosure.

Figure 15:
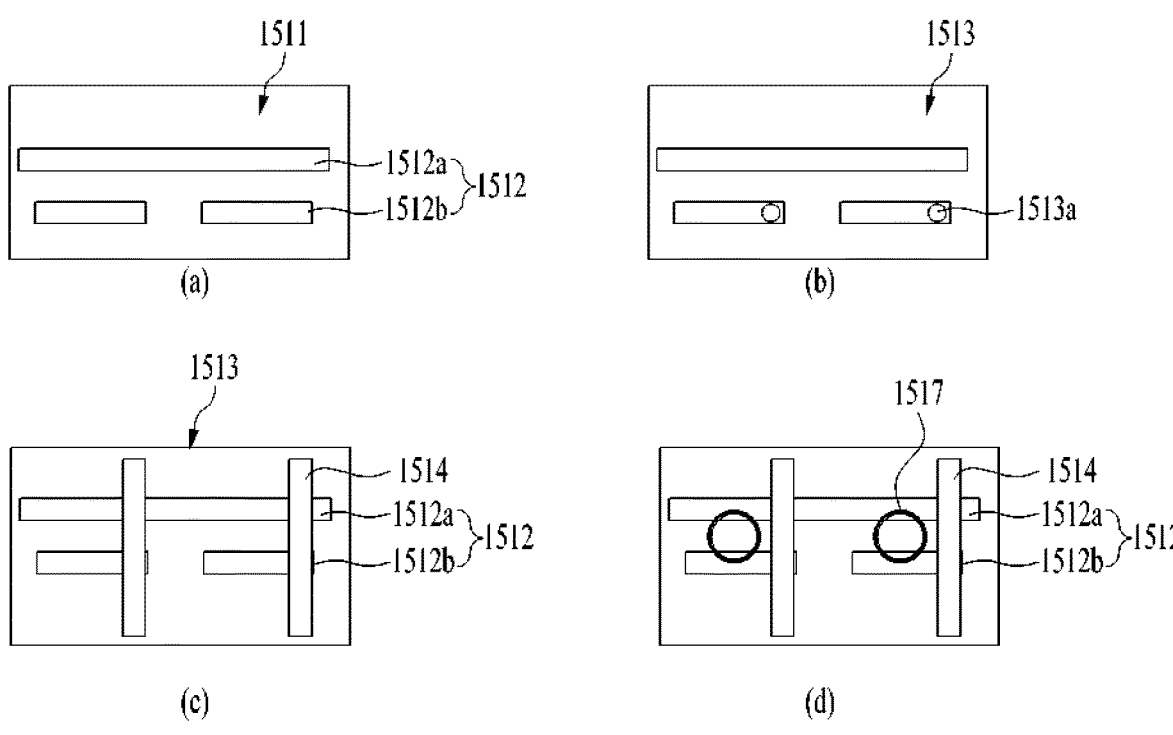
FIG. 15 is a plan view showing a method of manufacturing the assembly substrate according to the present disclosure.

FIG. 15 is a plan view showing a method of manufacturing the assembly substrate according to the present disclosure.

As shown in FIG. 15(a), first assembly electrodes 1512 are formed on a substrate 1511. The first assembly electrodes 1512 may include a pair of electrodes 1512a and 1512b oriented horizontally in the first direction. The pair of electrodes may include a working electrode to which an assembly voltage is applied and a reference electrode to which a ground voltage is applied. An electric field is generated by the voltage difference between the electrodes 1512a and 1512b, and then the semiconductor light emitting elements may be assembled into the assembly grooves in the assembly substrate by dielectrophoretic force.

Meanwhile, as shown in FIG. 15(a), one of the first assembly electrodes 1512 may be disposed on the substrate 1511 in the shape of a long bar in the first direction, and the other thereof may be formed in the shape of a short bar, and a plurality of short bars may be disposed so as to correspond to the long bar.

As shown in FIG. 15(b), a first insulating layer 1513 is formed on the first assembly electrodes, and then some portions of the first insulating layer 1513 are etched to form via holes 1513a through which some parts of the first assembly electrodes are exposed. The via holes 1513a may be located only on the short-bar-shaped first assembly electrodes. In addition, second assembly electrodes may be electrically connected to the short-bar-shaped first assembly electrodes through the via holes 1513a.

As shown in FIG. 15(c), second assembly electrodes 1514 may be formed on the first insulating layer 1513 so as to be oriented in the second direction, and may intersect the first assembly electrodes 1512. In addition, the second assembly electrodes 1514 are electrically connected to the short-bar-shaped first assembly electrodes 1512b through the via holes, and are insulated from the long-bar-shaped first assembly electrode 1512a by the first insulating layer 1513.

In addition, the short-bar-shaped first assembly electrode 1512b may be a working electrode or a reference electrode. When the first assembly electrode 1512b is a reference electrode, the second assembly electrodes 1514 may be electrically connected to the reference electrode. Therefore, when voltages are applied to the assembly electrodes in the subsequent assembly process, a ground voltage may be applied to the second assembly electrodes 1514. Meanwhile, the working electrode may be disposed in the shape of a long bar on the assembly substrate, and an assembly voltage may be applied thereto in the assembly process.

Alternatively, when the long-bar-shaped first assembly electrode 1512a is a reference electrode, the second assembly electrodes 1514 may be electrically connected to the short-bar-shaped first assembly electrodes 1512b. Here, each of the short-bar-shaped first assembly electrodes 1512b may be a working electrode. Therefore, when voltages are applied to the assembly electrodes in the subsequent assembly process, an assembly voltage may be applied to the second assembly electrodes 1514.

In addition, the first direction in which the first assembly electrodes 1512 are oriented and the second direction in which the second assembly electrodes 1514 are oriented may be perpendicular to each other. As will be described later, when the assembly electrodes are disposed on the assembly substrate, it may be advantageous from the aspect of space utilization for the first assembly electrodes and the second assembly electrodes to be disposed so as to intersect each other perpendicularly.

FIG. 15(d) is a plan view showing the case in which a second insulating layer is applied onto the substrate having formed thereon the second assembly electrodes and assembly grooves 1517 are defined by barrier ribs. As shown in FIG. 15(d), the assembly grooves 1517 are located between the pair of first assembly electrodes 1512 so as to overlap the same. That is, it can be seen that the assembly grooves 1517 overlap the working electrode and the reference electrode. In addition, the plurality of assembly grooves overlap the long-bar-shaped first assembly electrode 1512, and each of the assembly grooves overlaps a corresponding one of the short-bar-shaped first assembly electrodes 1512b. In addition, the second assembly electrodes 1514 are located adjacent to the assembly grooves 1517. In this case, the assembly grooves 1517 and the second assembly electrodes 1514 do not overlap each other.

FIG. 16 is a cross-sectional view showing a method of manufacturing the assembly substrate according to the present disclosure.

As shown in FIG. 16(a), a pair of first assembly electrodes 1512a and 1512b may be formed on a substrate 1511. In addition, the assembly electrodes 1512a and 1512b may be formed horizontally in a designated direction.

Thereafter, as shown in FIG. 16(b), a first insulating layer 1513 for protecting the first assembly electrodes is formed on the first assembly electrodes and the substrate.

Thereafter, as shown in FIG. 16(c), the portion of the first insulating layer 1513 that is located on one of the first assembly electrodes is etched to form a via hole 1513a. A second assembly electrode, which will be formed in a subsequent process, may be electrically connected to one of the first assembly electrodes through the via hole 1513a. In addition, as can be seen from FIG. 15(b), the first assembly electrode on which the via hole 1513a is located has a short-bar shape.

Thereafter, as shown in FIG. 16(d), a second assembly electrode 1514 is formed so as to be connected to one of the first assembly electrodes through the via hole. The remaining one of the first assembly electrodes, on which no via hole is located, may be electrically insulated from the second assembly electrode 1514 by the first insulating layer. In addition, the direction in which the second assembly electrode 1514 is formed is a direction intersecting the first assembly electrodes.

Thereafter, as shown in FIG. 16(*e*), a second insulating layer for protecting the second assembly electrode 1514 is formed. The second insulating layer 1515 may be formed in a concavo-convex pattern so as to correspond to the concavo-convex pattern of the second assembly electrode 1514. However, as shown in FIG. 16(*e*), the second insulating layer 1515 may be formed to have a certain degree of flatness depending on the thickness thereof. However, the present disclosure is not limited thereto.

Finally, as shown in FIG. 16(*f*), a barrier rib 1516 for defining an assembly groove is formed on the second insulating layer. The region surrounded by the barrier rib 1516 corresponds to an assembly groove, in which a semiconductor light emitting element is mounted. However, the assembly groove may be hidden depending on the cross-sectional direction. In FIG. 16(*f*), the cross-section of the portion at which the second assembly electrode is located is illustrated, and the assembly groove is not visible. Meanwhile, the barrier rib 1516 may be made of the same material as the second insulating layer. In addition, the barrier rib 1516 may be formed of a photoresist, which is a photosensitive material, thereby facilitating a pattern process for forming the assembly groove.

Figure 17:
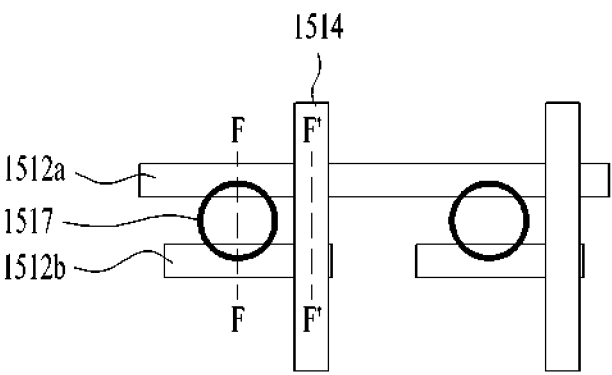

FIGS. 17 and 18 are views showing the cross-section of a specific portion of the assembly substrate.

FIG. 17 is a plan view schematically showing the first assembly electrodes, the second assembly electrodes, and the assembly grooves overlapping the first assembly electrodes, which are manufactured in the manufacturing process shown in FIG. 16. For intuitive understanding, illustration of the insulating layer formed between the assembly electrodes is omitted.

As shown in FIG. 17, the first assembly electrodes may include a long-bar-shaped electrode 1512*a* and a short-bar-shaped electrode 1512*b*. For example, as shown in FIG. 17, two short bars 1512*b* are formed so as to correspond to one long bar 1512*a*. The electrodes 1512*a* and 1512*b* are oriented horizontally in the first direction, and the second assembly electrodes 1514 are oriented in a direction intersecting the first direction. A plurality of second assembly electrodes 1514 may be located so as to be electrically connected to the short-bar-shaped electrodes 1512*b*. In addition, the assembly grooves 1517 are located at positions overlapping the first assembly electrodes 1512*a* and 1512*b*. The second assembly electrodes 1514 are located beside the assembly grooves 1517.

FIG. 18(*a*) is a cross-sectional view of the assembly substrate taken along line F-F in FIG. 17. In the cross-sectional view of the assembly substrate 1510 taken along line F-F, the assembly groove 1517 defined by the barrier rib 1516 is visible, but the second assembly electrode is not visible. Specifically, a pair of first assembly electrodes 1512*a* and 1512*b* are located on the substrate (or the base portion) 1511, and the first insulating layer 1513 is located on the first assembly electrodes 1512*a* and 1512*b*. In addition, the second insulating layer 1515 is located on the first insulating layer 1513, and the barrier rib 1516 is located on the second insulating layer 1515.

FIG. 18(*b*) is a cross-sectional view of the assembly substrate taken along line F'-F' in FIG. 17. In the cross-sectional view of the assembly substrate 1510 taken along line F'-F', the assembly groove is not visible, but the second assembly electrode 1514 is visible. Specifically, a pair of first assembly electrodes 1512*a* and 1512*b* are located on the substrate (or the base portion) 1511, and the first insulating layer 1513 is located on the first assembly electrodes 1512*a* and 1512*b*. In addition, the first assembly electrode 1512*b* and the second assembly electrode 1514 are electrically connected to each other through the via hole formed by etching a portion of the first insulating layer 1513. In addition, the second insulating layer 1515 is located on the second assembly electrode 1514, and the barrier rib 1516 is located on the second insulating layer 1515.

Figure 19:
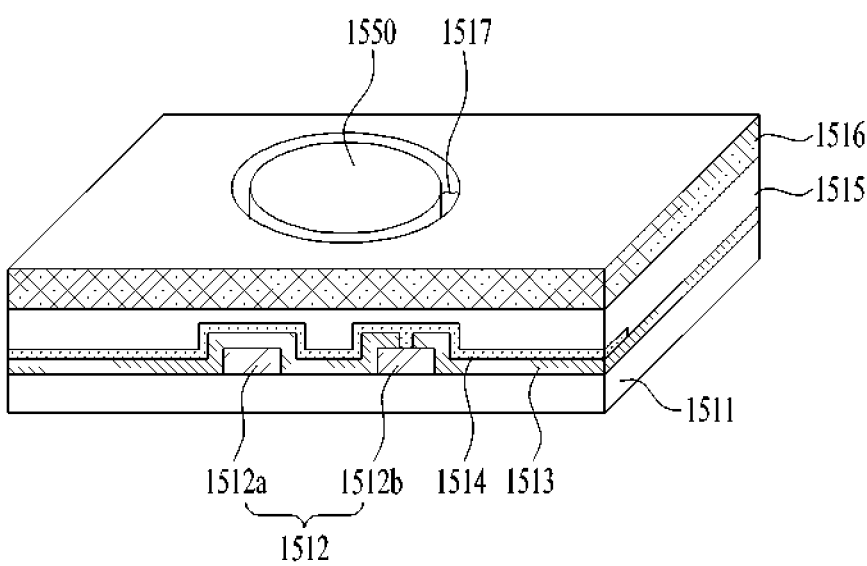
FIG. 19 is a cross-sectional view showing the state in which a semiconductor light emitting element is assembled to the assembly substrate according to the present disclosure.

FIG. 19 is a cross-sectional view showing the state in which a semiconductor light emitting element is assembled to the assembly substrate according to the present disclosure.

In FIG. 19, all of the first assembly electrodes 1512, the second assembly electrode 1514, and the assembly groove 1517 in the assembly substrate are visible.

As shown in FIG. 19, in the assembly substrate, a pair of first assembly electrodes 1512*a* and 1512*b* are located on the substrate (or the base portion) 1511, and the first insulating layer 1513 is located on the first assembly electrodes 1512*a* and 1512*b*. In addition, the first assembly electrode 1512*b* and the second assembly electrode 1514 are connected to each other through the via hole formed by etching a portion of the first insulating layer 1513. In addition, the second insulating layer 1515 is located on the second assembly electrode 1514, and the barrier rib 1516 is located on the second insulating layer 1515. The assembly groove 1517 is formed by the barrier rib 1516, and a semiconductor light emitting element 1550 is mounted (or assembled) onto an assembly surface (or a bottom surface) of the assembly groove 1517. Referring to FIG. 19, as described above, the assembly substrate having the semiconductor light emitting element mounted therein may be directly utilized as a panel of a display device. In this case, the assembly substrate may include a transistor for driving an active matrix. In addition, a separate wiring substrate, which has a larger area than the assembly substrate, may be provided, and the semiconductor light emitting element may be transferred onto the wiring substrate.

FIG. 20 illustrates various embodiments of the assembly substrate according to the present disclosure.

FIG. 20 is a view schematically showing first assembly electrodes, a second assembly electrode, and an assembly groove overlapping the first assembly electrodes. For intuitive understanding, illustration of an insulating layer formed between the assembly electrodes is omitted.

As shown in FIG. 20(*a*), an assembly groove 1917 may be formed at a position overlapping a pair of first assembly electrodes 1912*a* and 1912*b*, and a second assembly electrode 1914 may be located near the assembly groove 1917.

The first assembly electrodes 1912*a* and 1912*b* and the second assembly electrode 1914 may intersect each other at a predetermined angle, as shown in FIG. 20(*a*).

Similarly, as shown in FIG. 20(*b*), an assembly groove 2017 may be formed at a position overlapping a pair of first assembly electrodes 2012*a* and 2012*b*, and a second assembly electrode 2014 may be located near the assembly groove 2017.

It is important that the first assembly electrodes and the second assembly electrode be located so as to intersect each other, as described above, but the first assembly electrodes and the second assembly electrode do not need to be perpendicular to each other. However, an appropriate intersection angle may be set depending on the shape of the assembly substrate. For example, in the case of a rectangular-shaped panel, it may be efficient from the aspect of space utilization for the first assembly electrodes and the second assembly electrode to be formed so as to intersect each other perpendicularly.

Figure 21:
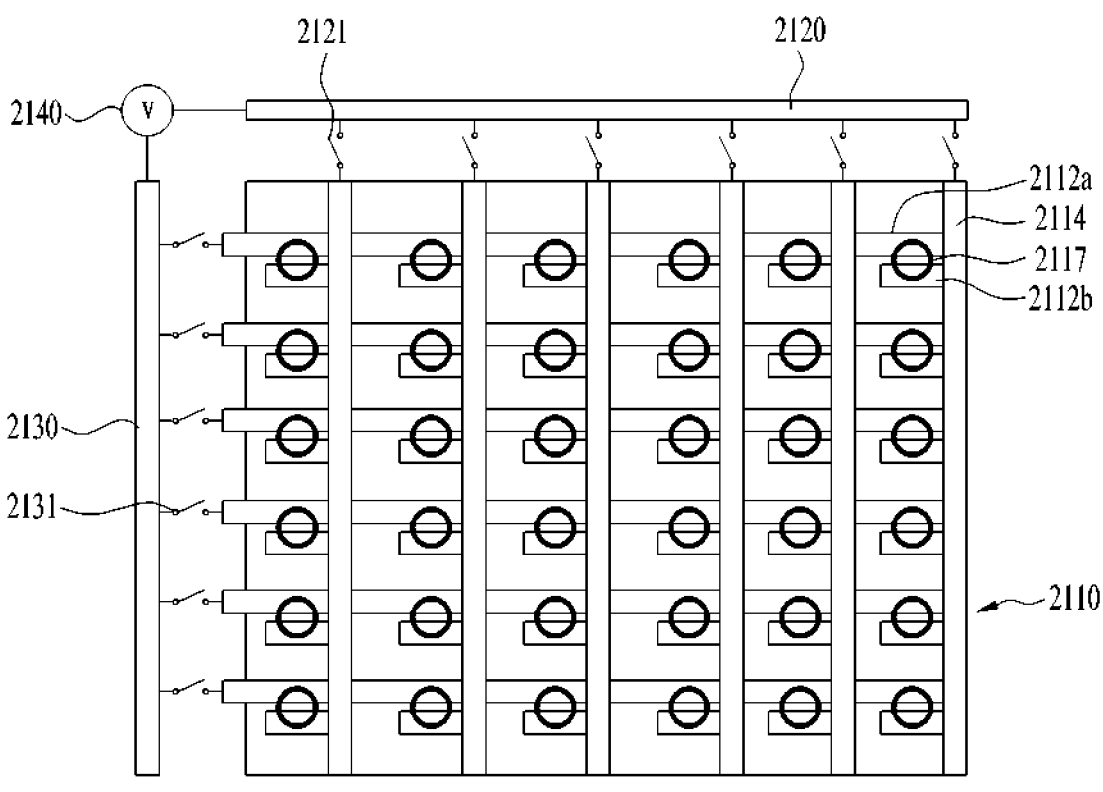
FIG. 21 is a diagram showing a method of applying voltages to assembly electrodes of the assembly substrate according to the present disclosure.

FIG. 21 is a diagram showing a method of applying voltages to the assembly electrodes of the assembly substrate according to the present disclosure.

In the assembly substrate 2110 shown in FIG. 21, a plurality of pairs of first assembly electrodes 2112a and 2112b are disposed so as to correspond to the shape of the substrate 2110. In addition, a plurality of second assembly electrodes 2114 may be disposed so as to intersect the first assembly electrodes 2112a and 2112b. In addition, an assembly groove 2117 is located so as to overlap each pair of first assembly electrodes 2112a and 2112b. For intuitive understanding, illustration of an insulating layer formed between the assembly electrodes is omitted.

In addition, as shown in FIG. 21, the plurality of second assembly electrodes 2114 are connected to a first common electrode 2120 for applying voltage thereto via a plurality of switches 2121. Each of the second assembly electrodes 2114 may be electrically connected to a corresponding one of the switches 2121. Therefore, voltage may be selectively applied to the plurality of second assembly electrodes 2114.

In addition, as shown in FIG. 21, the plurality of long-bar-shaped first assembly electrodes 2112a are connected to a second common electrode 2130 for applying voltage thereto via a plurality of switches 2131. Each of the first assembly electrodes 2112a may be electrically connected to a corresponding one of the switches 2131. Therefore, voltage may be selectively applied to the plurality of first assembly electrodes 2112a.

In addition, a power supply 2140 may be additionally provided in order to apply voltages to the first common electrode 2120 and the second common electrode 2130. Meanwhile, FIG. 21 is a schematic diagram showing the fundamental configuration for applying voltages to the assembly electrodes of the assembly substrate 2110 according to the present disclosure. However, the actual configuration does not need to be completely identical to the illustrated configuration, and it will be apparent to those skilled in the art that changes in or omission of some parts of the illustrated configuration is possible.

Voltages may be selectively applied to the plurality of first assembly electrodes 2112a and the plurality of second assembly electrodes 2114 through the configuration for applying voltages to the assembly substrate 2110 shown in FIG. 21. When the long-bar-shaped assembly electrode 2112a is a working electrode to which an assembly voltage is applied, the second assembly electrode 2114 may be connected to a reference electrode to which a ground voltage is applied. That is, the short-bar-shaped first assembly electrode 2112b serves as a reference electrode. Alternatively, when the long-bar-shaped assembly electrode 2112a is a reference electrode to which a ground voltage is applied, the second assembly electrode 2114 may be connected to a working electrode to which an assembly voltage is applied. That is, the short-bar-shaped first assembly electrode 2112b serves as a working electrode.

Accordingly, in the assembly substrate 2110, a semiconductor light emitting element may be assembled only into the assembly groove corresponding to the X-axis and the Y-axis to which voltages are applied. For example, when all of the switches 2121 and 2131 connected to the common electrodes 2120 and 2130 are closed, semiconductor light emitting elements may be assembled into all of the assembly grooves in the assembly substrate 2110. In addition, when all of the switches 2121 and 2131 connected to the common electrodes 2120 and 2130 are opened, it is difficult for semiconductor light emitting elements to be assembled into the assembly grooves in the assembly substrate 2110. In addition, it may be possible to control the switches and voltages so that semiconductor light emitting elements are assembled only into some assembly grooves corresponding to specific X-axis and Y-axis positions. That is, it can be understood that the assembly substrate of the present disclosure is a modified assembly substrate for driving of a passive matrix.

FIG. 22 illustrates diagrams showing semiconductor light emitting elements assembled to a general assembly substrate and semiconductor light emitting elements transferred onto a wiring substrate.

FIG. 22(a) illustrates a general assembly substrate 2210. A plurality of pairs of assembly electrodes 2212 and 2213 are disposed in the assembly substrate 2210 in consideration of the shape of a substrate. An assembly voltage and a ground voltage are applied to the assembly electrodes 2212 and 2213 by a power supply 2240. In addition, an electric field is generated due to the difference between the applied voltages, and semiconductor light emitting elements are assembled into assembly grooves in the assembly substrate 2210 by the electric field.

FIG. 22(a) is a diagram showing the state in which semiconductor light emitting elements 2251, 2252, and 2253 emitting red (R), green (G), and blue (B) light are assembled onto the assembly substrate 2210. The semiconductor light emitting elements 2251, 2252, and 2253 are subpixels of one unit pixel, and may be regularly arranged.

Meanwhile, the pair of assembly electrodes 2212 and 2213 are arranged horizontally in the shape of a long bar. As shown in FIG. 22(a), semiconductor light emitting elements of the same color may be arranged in one specific direction so as to correspond to the arrangement of the assembly electrodes.

When the arrangement of the pair of assembly electrodes 2212 and 2213 in the assembly substrate 2210 is expressed as one line, the semiconductor light emitting elements are assembled simultaneously into the assembly grooves located in the corresponding line. That is, it is difficult to assemble individual semiconductor light emitting elements into respective assembly grooves in the line at different times.

In addition, when a defective semiconductor light emitting element is assembled into a specific assembly groove in the corresponding line during the assembly process, a reassembly process is required for all of the semiconductor light emitting elements in the line. That is, a reassembly process is performed after separating all of the semiconductor light emitting elements from the assembly grooves by applying a voltage that prevents the semiconductor light emitting elements from being fixed in the assembly grooves in the line. In other words, in the case of the assembly substrate shown in FIG. 22(a), it is difficult to individually repair semiconductor light emitting elements corresponding to respective assembly grooves in the line.

Therefore, in general, semiconductor light emitting elements of the same color are assembled in the line, and semiconductor light emitting elements of another color are assembled in another line.

FIG. 22(b) is a plan view showing the state in which the semiconductor light emitting elements assembled to the assembly substrate shown in FIG. 22(a) are transferred onto a wiring substrate.

As shown in FIG. 22(*b*), the semiconductor light emitting elements 2251, 2252, and 2253 constituting one unit pixel 3250 may be regularly arranged on a wiring substrate 3210.

However, the regular arrangement of the semiconductor light emitting elements 2251, 2252, and 2253 in the unit pixel 3250 may be limited to arrangement only in one direction along the X-axis or the Y-axis. In the conventional assembly substrate, a pair of assembly electrodes are formed so as to be elongated in one direction along the X-axis or the Y-axis, and accordingly, semiconductor light emitting elements are assembled only in this direction.

Figure 23:
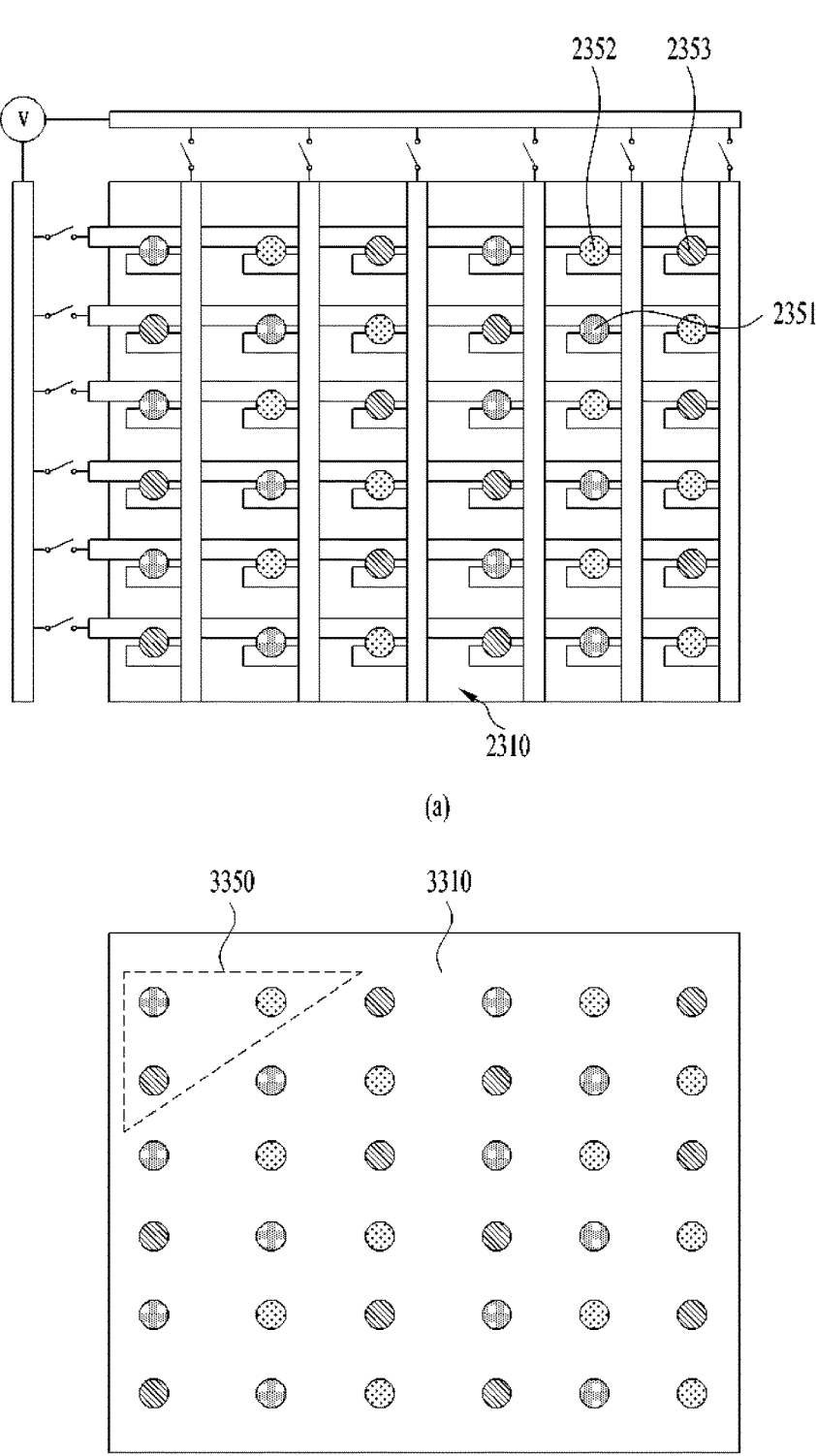
FIG. 23 illustrates diagrams showing semiconductor light emitting elements assembled to the assembly substrate of the present disclosure and semiconductor light emitting elements transferred onto a wiring substrate.

FIG. 23 illustrates diagrams showing semiconductor light emitting elements assembled to the assembly substrate of the present disclosure and semiconductor light emitting elements transferred onto a wiring substrate.

FIG. 23(*a*) illustrates an assembly substrate 2310 of the present disclosure. Similar to what is illustrated in FIG. 21, a plurality of pairs of first assembly electrodes and a plurality of second assembly electrodes intersecting the first assembly electrodes are disposed in the assembly substrate 2310. Assembly grooves are formed near the intersection points between the first assembly electrodes and the second assembly electrodes, and semiconductor light emitting elements may be mounted (or assembled) into the assembly grooves by applying voltages to the first assembly electrodes and the second assembly electrodes corresponding to the respective intersection points. That is, a semiconductor light emitting element of a desired color may be assembled to a specific point defined by the X-axis and the Y-axis. For example, semiconductor light emitting elements 2351, 2352, and 2353 emitting red (R), green (G), and blue (B) light may be disposed in one plane, as shown in FIG. 23(*a*), rather than in one straight line.

In addition, when the long-bar-shaped first assembly electrode is expressed as one line, a plurality of assembly grooves may be formed so as to overlap the line, and semiconductor light emitting elements may be assembled into respective assembly grooves in the line at different times. Accordingly, it may be possible to assemble semiconductor light emitting elements of different colors to the same line.

In addition, when a defective semiconductor light emitting element is assembled into a specific assembly groove in the corresponding line during the assembly process, only the defective semiconductor light emitting element in the specific assembly groove may be reassembled. For example, since it is possible to apply voltages to the first assembly electrode and the second assembly electrode corresponding to the assembly groove, the defective semiconductor light emitting element is removed from the assembly groove, and then a new semiconductor light emitting element is mounted into the assembly groove. That is, in the case of the assembly substrate shown in FIG. 23, it may be possible to individually repair semiconductor light emitting elements corresponding to respective assembly grooves in the line.

In addition, when semiconductor light emitting elements are not assembled into some of the plurality of assembly grooves in the corresponding line during the assembly process, voltages may be reapplied to the first assembly electrodes and the second assembly electrodes so that semiconductor light emitting elements are assembled. For example, when the first assembly electrodes are formed such that a long-bar-shaped working electrode is disposed and a plurality of short-bar-shaped reference electrodes are disposed so as to correspond to the long-bar-shaped working electrode, an assembly voltage may be applied to the working electrode. In addition, a ground voltage may be applied to the second assembly electrodes corresponding to some specific assembly grooves into which semiconductor light emitting elements have not been assembled, thereby forcibly assembling semiconductor light emitting elements into the specific assembly grooves.

FIG. 23(*b*) is a plan view showing the state in which the semiconductor light emitting elements assembled to the assembly substrate shown in FIG. 23(*a*) are transferred onto a wiring substrate.

As shown in FIG. 23(*b*), the semiconductor light emitting elements constituting one unit pixel 3350 may be arranged in one plane of a wiring substrate 3310.

However, the case illustrated in FIG. 23(*b*) is merely given as one exemplary embodiment, and semiconductor light emitting elements may be transferred onto the wiring substrate in any of various arrangement patterns through the assembly substrate of the present disclosure.

FIG. 24 illustrates various embodiments of arrangements in which semiconductor light emitting elements are assembled to the assembly substrate of the present disclosure.

FIG. 24(*a*) illustrates the general stripe-pattern arrangement of semiconductor light emitting elements. As shown in FIG. 24(*a*), semiconductor light emitting elements 2451*a*, 2452*a*, and 2453*a* corresponding to red (R), green (G), and blue (B) may be arranged in one direction along the X-axis or the Y-axis.

FIG. 24(*b*) illustrates pentile-pattern arrangement of semiconductor light emitting elements. Since the sense of sight of a human being is more sensitive to green (G) than to blue (B) or red (R), semiconductor light emitting elements 2451*b*, 2452*b*, and 2453*b* may be arranged to form an RGBG structure, as shown in FIG. 24(*b*), thereby reducing resolution loss.

FIG. 24(*c*) illustrates diamond-pentile-pattern arrangement of semiconductor light emitting elements. As shown in FIG. 24(*c*), semiconductor light emitting elements 2451*c*, 2452*c*, and 2453*c* may be arranged to form a diamond pentile structure.

In this way, in the assembly substrate of the present disclosure, it may be possible to arrange semiconductor light emitting elements of different colors at desired positions in the substrate. Further, it may be possible to improve the resolution, contrast ratio, and luminance of the display device by appropriately arranging semiconductor light emitting elements in the substrate.

Figure 25:
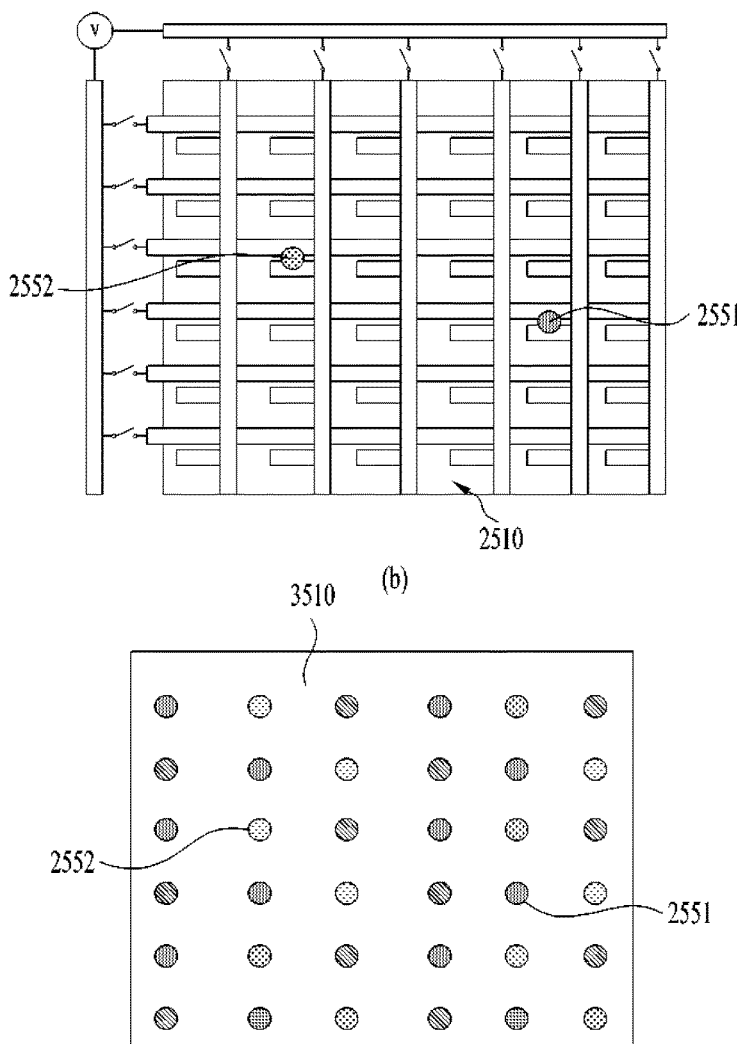
FIG. 25 is a plan view illustrating a method of repairing a defective region in a wiring substrate using the assembly substrate of the present disclosure as a repair substrate after transferring semiconductor light emitting elements onto the wiring substrate.

FIG. 25 is a plan view illustrating a method of repairing a defective region in a wiring substrate using the assembly substrate of the present disclosure as a repair substrate after transferring semiconductor light emitting elements onto the wiring substrate.

FIG. 25(*a*) illustrates the case in which some regions 3551*a* and 3552*a* of a wiring substrate 3510 are found to be defective after semiconductor light emitting elements are transferred onto the wiring substrate 3510. The regions 3551*a* and 3552*a* are regions onto which a red semiconductor light emitting element and a green semiconductor light emitting element, which are scheduled to be transferred thereto, have not been properly transferred. Even if semiconductor light emitting elements are properly transferred onto most regions of the wiring substrate 3510, if some regions thereof are defective, as shown in FIG. 25(*a*), the wiring substrate 3510 is considered to be a defective substrate, and is thus difficult to commercialize. Therefore, the defective regions 3551*a* and 3552*a* onto which no semiconductor light emitting element has been transferred need to be repaired.

FIG. 25(b) is a diagram illustrating use of the assembly substrate 2510 of the present disclosure as a repair substrate for repair of the defective regions shown in FIG. 25(a). In the case of a conventional assembly substrate, it is difficult to assemble semiconductor light emitting elements only to specific portions of the substrate. In contrast, in the case of the assembly substrate of the present disclosure, it is possible to assemble semiconductor light emitting elements only to specific portions of the substrate. For example, as shown in FIG. 25(b), a red semiconductor light emitting element 2551 and a green semiconductor light emitting element 2552 may be assembled into assembly grooves in the assembly substrate 2510 corresponding to the defective regions 3551a and 3552a shown in FIG. 25(a).

Thereafter, the semiconductor light emitting elements 2551 and 2552 on the assembly substrate shown in FIG. 25(b) are transferred onto the wiring substrate shown in FIG. 25(a), with the result that the defective regions in the wiring substrate 3510 are repaired, as shown in FIG. 25(c).

Figure 26:
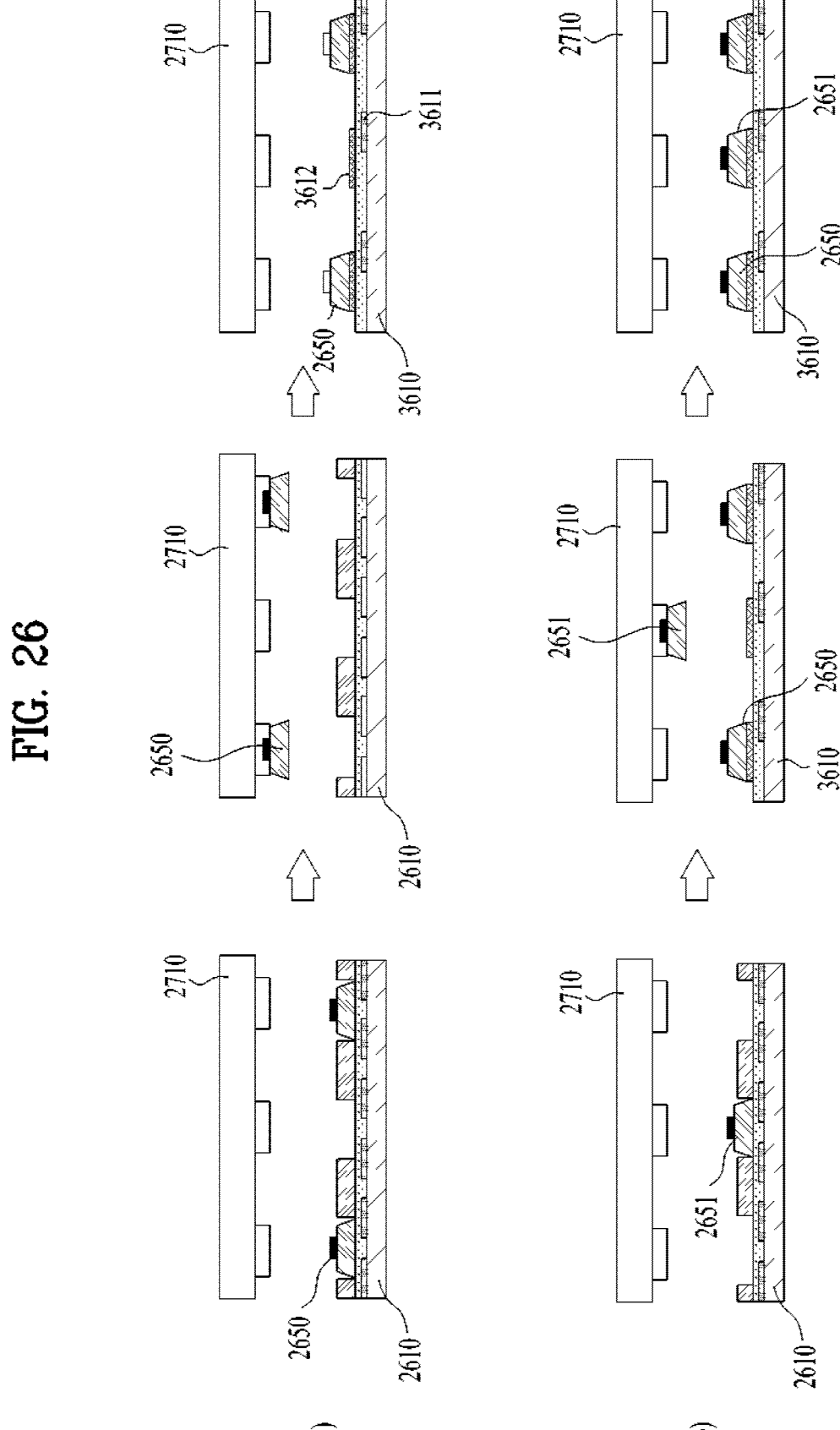
FIG. 26 is a cross-sectional view illustrating a method of repairing a defective region in a wiring substrate using the assembly substrate of the present disclosure as a repair substrate after transferring semiconductor light emitting elements onto the wiring substrate.

FIG. 26 is a cross-sectional view illustrating a method of repairing a defective region in a wiring substrate using the assembly substrate of the present disclosure as a repair substrate after transferring semiconductor light emitting elements onto the wiring substrate.

FIG. 26(a) illustrates the case in which semiconductor light emitting elements on the assembly substrate 2610 having some defective regions are transferred onto the wiring substrate.

As shown in FIG. 26(a), semiconductor light emitting elements 2650 may be assembled or mounted to an assembly substrate 2610. In addition, a transfer substrate 2710 may be additionally required in order to transfer the assembled semiconductor light emitting elements 2650 onto a wiring substrate. The transfer substrate 2710 may include an organic stamp layer. In addition, the transfer substrate 2710 may include protrusions corresponding to the semiconductor light emitting elements 2650, so the semiconductor light emitting elements may be transferred and attached to the protrusions.

Thereafter, the semiconductor light emitting elements 2650 transferred onto the transfer substrate 2710 may be transferred onto a wiring substrate 3610 including an adhesive layer 3612 and transistors 3611. The adhesive layer 3612 has greater adhesive force than the transfer substrate 2710, so the semiconductor light emitting elements 2650 may be transferred from the transfer substrate 2710 onto the wiring substrate 3610.

Meanwhile, when semiconductor light emitting elements are not assembled into some of the assembly grooves in the assembly substrate 2610, regions of the wiring substrate 3610 corresponding thereto become defective. Therefore, it is necessary to repair the defective regions of the wiring substrate 3610.

FIG. 26(b) is a view illustrating use of the assembly substrate 2610 of the present disclosure as a repair substrate for repair of the defective region shown in FIG. 26(a). As shown in FIG. 26(b), a semiconductor light emitting element 2651 may be assembled into an assembly groove in the assembly substrate 2610 corresponding to the defective region shown in FIG. 26(a).

Thereafter, the semiconductor light emitting element 2651 is transferred onto the wiring substrate 3610 using the transfer substrate 2710. Accordingly, the semiconductor light emitting element 2651 is assembled to the defective region of the wiring substrate 3610 in the state in which the other semiconductor light emitting elements 2650 are already assembled to the remaining regions. In this way, the defective region of the wiring substrate 3610 may be repaired.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:

1. A display device comprising:
a first assembly electrode located on a substrate;
a first insulating layer located on the first assembly electrode;
a second assembly electrode located on the first insulating layer, the second assembly electrode being electrically connected to a part of the first assembly electrode exposed through an etched portion of the first insulating layer;
a second insulating layer located on the second assembly electrode;
a barrier rib located on the second insulating layer to define an assembly groove to receive therein a semiconductor light emitting element configured to form an individual pixel; and
the semiconductor light emitting element being located in the assembly groove,
wherein the first assembly electrode comprises a pair of electrodes, the pair of electrodes including at least one working electrode configured to receive an assembly voltage applied thereto and at least one reference electrode configured to receive a ground voltage applied thereto,
wherein the at least one working electrode is disposed on the substrate in a shape of a long bar, and
wherein the at least one reference electrode is provided in a plurality of short bars corresponding to the long bar of the at least one working electrode, wherein
The assembly groove is located so as to overlap the at least one working electrode and the at least one reference electrode.

2. The display device of claim 1, wherein the first assembly electrode is oriented in a first direction, and the second assembly electrode is oriented in a second direction intersecting the first direction.

3. The display device of claim 2, wherein the pair of electrodes are oriented in the first direction.

4. The display device of claim 1, wherein the second assembly electrode is electrically connected to the at least one reference electrode.

5. The display device of claim 1, wherein the second assembly electrode is electrically connected to the at least one working electrode.

6. The display device of claim 2, wherein the first direction and the second direction are perpendicular to each other.

7. A method of manufacturing a display device, the method comprising:

separating a plurality of semiconductor light emitting elements disposed on a first substrate, from the first substrate;

preparing a second substrate including a first assembly electrode and a second assembly electrode intersecting the first assembly electrode; and assembling the plurality of semiconductor light emitting elements to the second substrate including the first assembly electrode and the second assembly electrode using an electric field and a magnetic field by dispersing the plurality of semiconductor light emitting elements in a fluid, wherein the preparing the second substrate comprises:

forming the first assembly electrode on a base substrate;

forming a first insulating layer on the first assembly electrode;

forming the second assembly electrode on the first insulating layer so as to be electrically connected to a part of the first assembly electrode exposed by etching a portion of the first insulating layer;

forming a second insulating layer on the second assembly electrode; and forming a barrier rib on the second insulating layer to define a plurality of assembly grooves to receive therein the plurality of semiconductor light emitting elements configured to form individual pixels, wherein the first assembly electrode comprises a pair of electrodes, the pair of electrodes including at least one working electrode configured to receive an assembly voltage applied thereto and at least one reference electrode configured to receive a ground voltage applied thereto, wherein the at least one working electrode is disposed on the substrate in a shape of a long bar, and wherein the at least one reference electrode is provided in a plurality of short bars corresponding to the long bar of the working electrode, wherein The plurality of assembly grooves are located so as to overlap the at least one working electrode and the at least one reference electrode.

8. The method of claim 7, wherein the at least one working electrode and the at least one reference electrode are oriented in a specific direction, and wherein the assembling the plurality of semiconductor light emitting elements to the second substrate comprises:

applying an assembly voltage to the at least one working electrode; and applying a ground voltage to the at least one reference electrode.

9. The method of claim 8, wherein the assembling the plurality of semiconductor light emitting elements to the second substrate comprises:

when a semiconductor light emitting element is not mounted into any of the plurality of assembly grooves, applying an assembly voltage to the at least one working electrode; and applying a ground voltage to a second assembly electrode corresponding to an assembly groove having no semiconductor light emitting element mounted therein.

10. The method of claim 9, further comprising:

after the assembling the plurality of semiconductor light emitting elements to the second substrate, transferring the plurality of semiconductor light emitting elements onto a third substrate comprising a transistor for driving of an active matrix.

11. The method of claim 10, further comprising:

when a semiconductor light emitting element is not transferred onto a specific point in the third substrate, assembling a semiconductor light emitting element corresponding to the specific point to the second substrate; and transferring the semiconductor light emitting element assembled to the second substrate onto the third substrate.

12. The method of claim 7, wherein the first substrate is either a growth substrate configured to form the plurality of semiconductor light emitting elements thereon or a transfer substrate configured to receive the plurality of semiconductor light emitting elements transferred thereto from the growth substrate.

13. The method of claim 7, wherein in the assembling the plurality of semiconductor light emitting elements to the second substrate, the plurality of semiconductor light emitting elements are arranged to have a pentile pattern or a diamond-pentile pattern per pixel unit.

14. The display device of claim 2, wherein the first direction and the second direction form an acute or obtuse angle.

* * * * *